(12) United States Patent
Islam et al.

(10) Patent No.: US 12,092,862 B2
(45) Date of Patent: Sep. 17, 2024

(54) PHOTONIC SEMICONDUCTOR DEVICE AND METHOD

(71) Applicant: Taiwan Semiconductor Manufacturing Co., Ltd., Hsinchu (TW)

(72) Inventors: Mohammed Rabiul Islam, Austin, TX (US); Stefan Rusu, Sunnyvale, CA (US); Weiwei Song, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/327,415

(22) Filed: Jun. 1, 2023

(65) Prior Publication Data

US 2023/0305226 A1   Sep. 28, 2023

Related U.S. Application Data

(60) Continuation of application No. 17/567,349, filed on Jan. 3, 2022, now Pat. No. 11,703,639, which is a
(Continued)

(51) Int. Cl.
*G02B 6/12* (2006.01)
*G02B 6/13* (2006.01)
(Continued)

(52) U.S. Cl.
CPC .......... *G02B 6/12004* (2013.01); *G02B 6/13* (2013.01); *H01L 24/16* (2013.01); *H01L 25/00* (2013.01);
(Continued)

(58) Field of Classification Search
None
See application file for complete search history.

(56) References Cited

U.S. PATENT DOCUMENTS

| | | |
|---|---|---|
| 8,993,380 B2 | 3/2015 | Hou et al. |
| 9,000,584 B2 | 4/2015 | Lin et al. |
| | (Continued) | |

FOREIGN PATENT DOCUMENTS

| | | |
|---|---|---|
| CN | 104124304 A | 10/2014 |
| DE | 102019117629 A1 | 2/2020 |
| | (Continued) | |

*Primary Examiner* — Jerry Rahll
(74) *Attorney, Agent, or Firm* — Slater Matsil, LLP

(57) ABSTRACT

A structure includes an optical interposer attached to a package substrate, wherein the optical interposer includes a silicon waveguide, a first photonic component optically coupled to the silicon waveguide, a second photonic component optically coupled to the silicon waveguide, and an interconnect structure extending over the silicon waveguide, over the first photonic component, and over the second photonic component, wherein the interconnect structure is electrically connected to the first photonic component and to the second photonic component, a first semiconductor device attached to the interconnect structure, wherein the first semiconductor device is electrically connected to the first photonic component through the interconnect structure, and a second semiconductor device attached to the interconnect structure, wherein the second semiconductor device is electrically connected to the second photonic component through the interconnect structure.

20 Claims, 24 Drawing Sheets

Related U.S. Application Data division of application No. 16/803,153, filed on Feb. 27, 2020, now Pat. No. 11,215,753.

(51) Int. Cl.
  H01L 23/00 (2006.01)
  H01L 25/00 (2006.01)
  H01L 21/48 (2006.01)
  H01L 23/538 (2006.01)

(52) U.S. Cl.
  CPC .............. *G02B 2006/12107* (2013.01); *G02B 2006/12142* (2013.01); *H01L 21/486* (2013.01); *H01L 23/5385* (2013.01); *H01L 2224/16227* (2013.01)

(56) References Cited

U.S. PATENT DOCUMENTS

| | | | |
|---|---|---|---|
| 9,025,913 | B2 | 5/2015 | Lee et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,299,649 | B2 | 3/2016 | Chiu et al. |
| 9,368,460 | B2 | 6/2016 | Yu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 9,786,641 | B2 | 10/2017 | Budd et al. |
| 9,813,161 | B2 | 11/2017 | Peterson et al. |
| 2006/0050493 | A1 | 3/2006 | Hamasaki et al. |
| 2011/0206379 | A1* | 8/2011 | Budd .................... H05K 1/141 250/208.2 |
| 2014/0312443 | A1 | 10/2014 | Assefa et al. |
| 2015/0003841 | A1 | 1/2015 | McLaren et al. |
| 2015/0255639 | A1 | 9/2015 | Pelouard et al. |
| 2015/0285998 | A1 | 10/2015 | Babakhani et al. |
| 2016/0277115 | A1 | 9/2016 | Peterson et al. |
| 2017/0047312 | A1 | 2/2017 | Budd et al. |
| 2017/0207197 | A1 | 7/2017 | Yu et al. |
| 2018/0040597 | A1 | 2/2018 | Budd et al. |
| 2018/0314003 | A1 | 11/2018 | Coolbaugh et al. |
| 2019/0326266 | A1 | 10/2019 | Traverso et al. |
| 2019/0333905 | A1 | 10/2019 | Raghunathan et al. |
| 2020/0003950 | A1 | 1/2020 | Yu et al. |
| 2020/0395302 | A1 | 12/2020 | Yu et al. |

FOREIGN PATENT DOCUMENTS

| | | |
|---|---|---|
| KR | 20070073725 A | 7/2007 |
| KR | 20120116823 A | 10/2012 |
| KR | 20190101362 A | 8/2019 |
| KR | 20200001557 A | 1/2020 |
| TW | 201424017 A | 6/2014 |
| TW | 201830688 A | 8/2018 |
| TW | 201910832 A | 3/2019 |
| TW | 202046396 A | 12/2020 |
| TW | 202114087 A | 4/2021 |
| WO | 2018098146 A1 | 5/2018 |
| WO | 2019207363 A1 | 10/2019 |

* cited by examiner

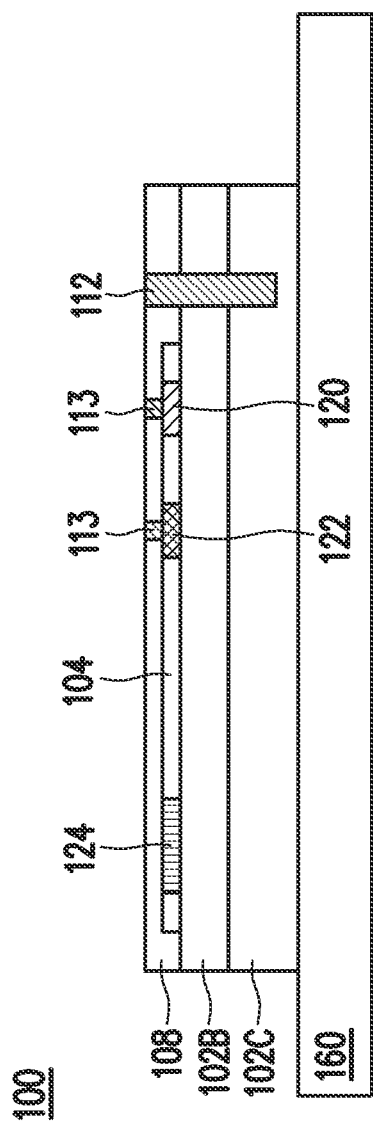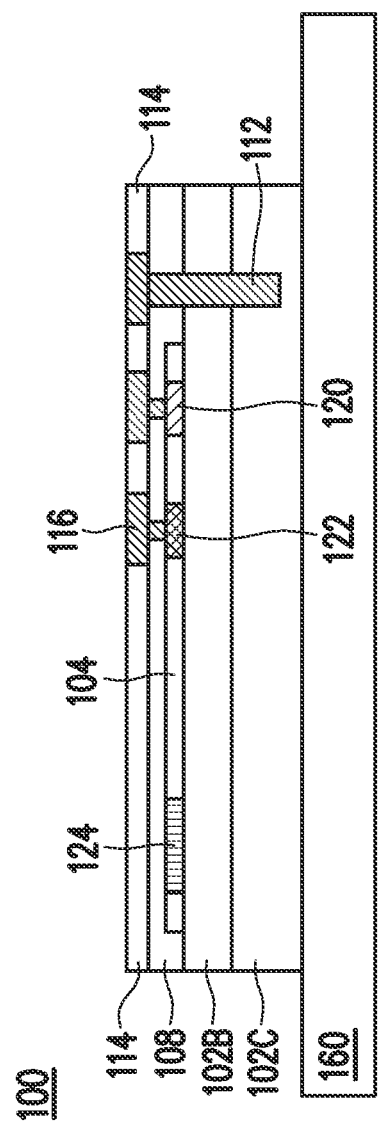

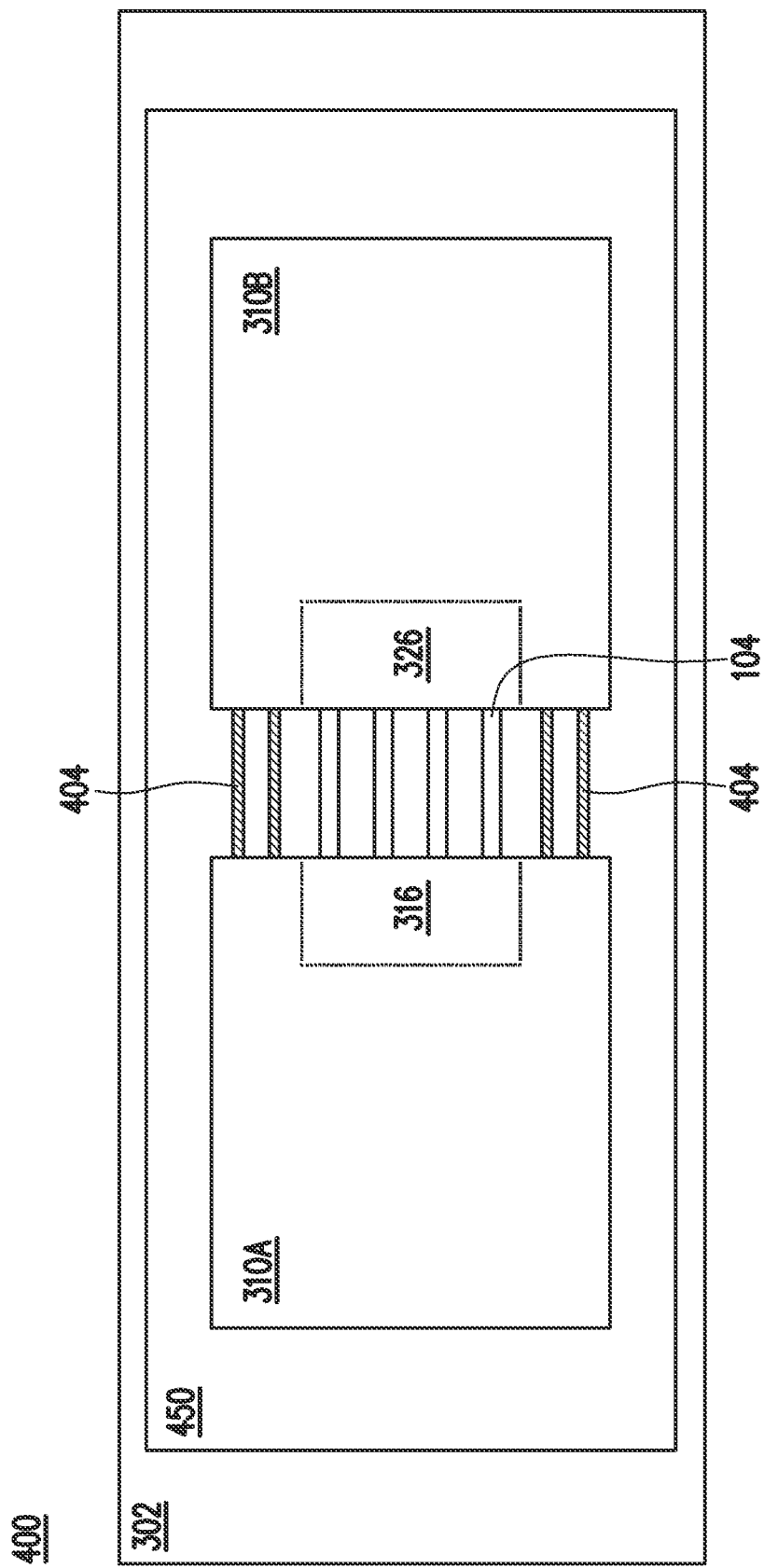

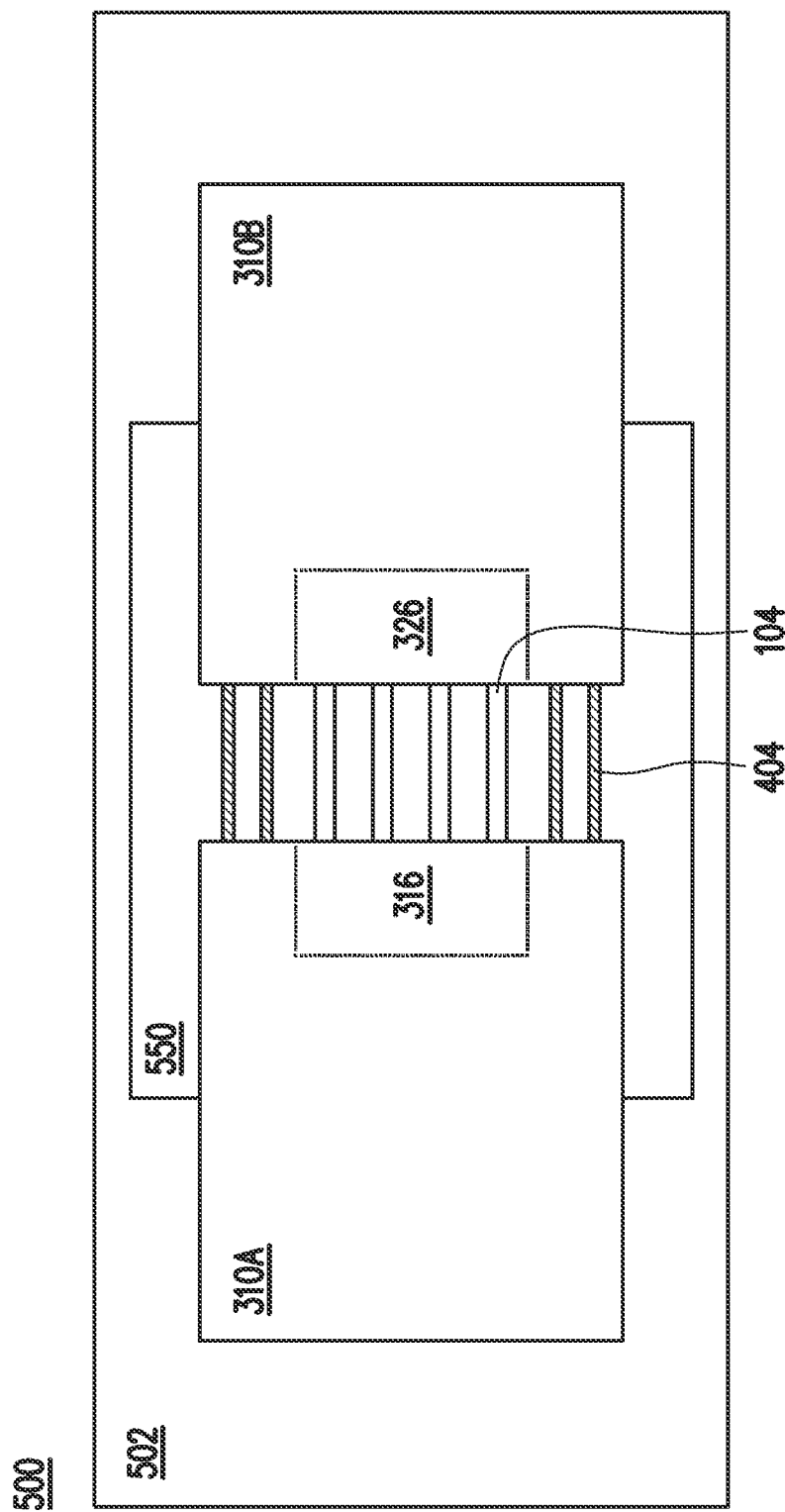

PHOTONIC SEMICONDUCTOR DEVICE AND METHOD

PRIORITY CLAIM AND CROSS-REFERENCE

This application is a continuation of U.S. patent application Ser. No. 17/567,349, filed on Jan. 3, 2022, which application is a divisional of U.S. patent application Ser. No. 16/803,153, filed on Feb. 27, 2020, now U.S. Pat. No. 11,215,753 issued Jan. 4, 2022, which applications are incorporated herein by reference.

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 9 show cross-sectional views of intermediate steps of forming an optical interposer, in accordance with some embodiments.

FIGS. 21A-B show a cross-sectional view and a plan view of a computing system, in accordance with some embodiments.

FIGS. 22A-B show a cross-sectional view and a plan view of a computing system, in accordance with some embodiments.

DETAILED DESCRIPTION

Figure 1:
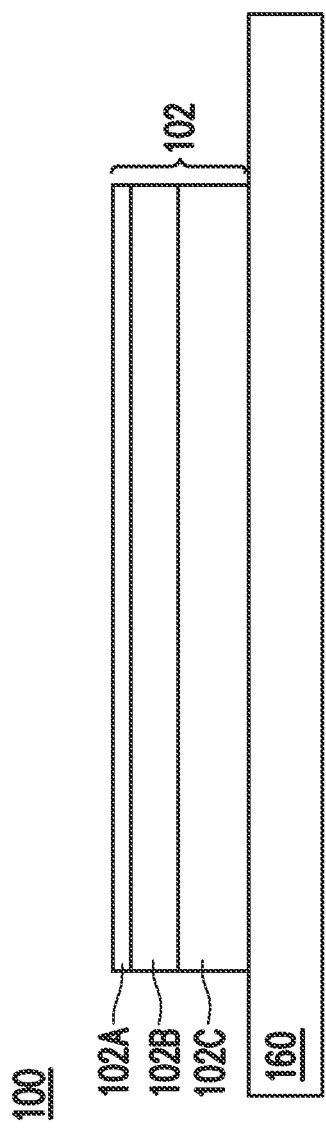

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of computing systems and the formation thereof are described. Three-dimensional (3D) packages including both photonic devices and electronic devices, and the method of forming the same are provided, in accordance with some embodiments. In particular, an optical interposer comprising waveguides and photonic devices enables optical communication for a computing system. Optical fibers may be attached to the optical interposer to provide optical communication with external components. The optical interposer may also have waveguides that facilitate optical communication between components within a computing system. The intermediate stages of forming the computing systems are illustrated, in accordance with some embodiments. Some variations of some embodiments are discussed. Throughout the various views and illustrative embodiments, like reference numbers are used to designate like elements.

FIGS. 1 through 11 show cross-sectional views of intermediate steps of forming an optical interposer 100 (see FIGS. 10-11), in accordance with some embodiments. In some embodiments, the optical interposer 100 acts as an optical interconnect that enables high-bandwidth optical communication in a computing system (e.g., the computing system 300 of FIG. 19). Turning first to FIG. 1, a buried oxide ("BOX") substrate 102 is attached to a first carrier 160, in accordance with some embodiments. The first carrier 160 may be, for example, a wafer (e.g., a silicon wafer), a panel, a glass substrate, a ceramic substrate, or the like. The BOX substrate 102 may be attached to the first carrier 160 using, for example, an adhesive or a release layer (not shown).

The BOX substrate 102 includes an oxide layer 102B formed over a substrate 102C, and a silicon layer 102A formed over the oxide layer 102B. The substrate 102C may be, for example, a material such as a glass, ceramic, dielectric, a semiconductor, the like, or a combination thereof. In some embodiments, the substrate 102C may be a semiconductor substrate, such as a bulk semiconductor or the like, which may be doped (e.g., with a p-type or an n-type dopant) or undoped. The substrate 102C may be a wafer, such as a silicon wafer (e.g., a 12-inch silicon wafer). Other substrates, such as a multi-layered or gradient substrate may also be used. In some embodiments, the semiconductor material of the substrate 102C may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; the like, or combinations thereof. The oxide layer 102B may be, for example, a silicon oxide or the like. In some embodiments, the oxide layer 102B may have a thickness between about 0.5 μm and about 4 μm, in some embodiments. The silicon layer 102A may have a thickness between about 0.1 μm and about 1.5 μm, in some embodiments. These thicknesses are examples, and other values are possible and considered within the scope of this disclosure. The BOX substrate 102 may be referred to as having a front side or front surface (e.g., the side facing upwards in FIG. 1), and a back side or back surface (e.g., the side facing downwards in FIG. 1, which is attached to the first carrier 160).

Figure 2:
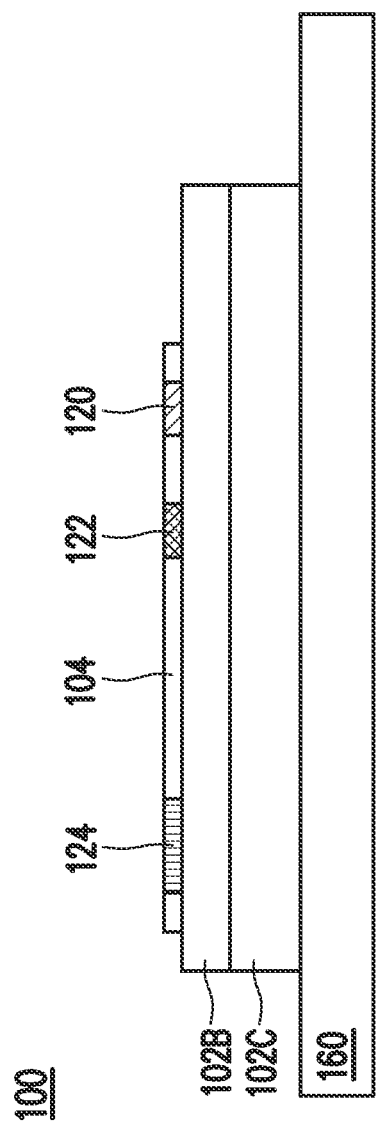

In FIG. 2, the silicon layer 102A is patterned to form silicon regions for waveguides 104 and photonic components, in accordance with some embodiments. The silicon layer 102A may be patterned using suitable photolithography and etching techniques. For example, a hardmask layer (e.g., a nitride layer or other dielectric material, not shown in FIG. 2) may be formed over the silicon layer 102A and patterned, in some embodiments. The pattern of the hardmask layer may then be transferred to the silicon layer 102A using one or more etching techniques, such as dry etching and/or wet etching techniques. For example, the silicon layer 102A may be etched to form recesses defining the waveguides 104, with regions of the remaining silicon forming the waveguides 104 and with sidewalls of the remaining unrecessed portions defining sidewalls of the waveguides 104. In some embodiments, more than one photolithography and etching sequence may be used in order to pattern the silicon layer 102A. One waveguide 104 or multiple waveguides 104 may be patterned from the silicon layer 102A. If multiple waveguides 104 are formed, the multiple waveguides 104 may be individual separate waveguides 104 or connected as a single continuous structure. In some embodiments, one or more of the waveguides 104 form a continuous loop. Other configurations or arrangements of the waveguides 104 are possible.

Still referring to FIG. 2, photonic components such as photodetectors 120, optical modulators 122, and grating couplers 124, are also formed in the silicon layer 102A, in accordance with some embodiments. The photonic components are optically coupled to the waveguides 104 to interact with optical signals within the waveguides 104, and may physically contact the waveguides 104 or be separated from the waveguides 104. The photonic components may be integrated with the waveguides 104, and may be formed using some or all of the same processing steps used for forming the silicon waveguides 104. One or more photodetectors 120 may be optically coupled to the waveguides 104 to detect optical signals within the waveguides 104, and one or more modulators 122 may be optically coupled to the waveguides 104 to generate optical signals within the waveguides 104 by modulating optical power within the waveguides 104.

In some embodiments, the photodetectors 120 may be formed by, for example, partially etching regions of the waveguides 104 and growing an epitaxial material on the remaining silicon of the etched regions. The waveguides 104 may be etched using acceptable photolithography and etching techniques. The epitaxial material may comprise, for example, a semiconductor material such as germanium (Ge), which may be doped or undoped. In some embodiments, an implantation process may be performed to introduce dopants within the silicon of the etched regions as part of the formation of the photodetectors 120. The silicon of the etched regions may be doped with p-type dopants, n-type dopants, or a combination.

In some embodiments, the modulators 122 may be formed by, for example, partially etching regions of the waveguides 104 and then implanting appropriate dopants within the remaining silicon of the etched regions. The waveguides 104 may be etched using acceptable photolithography and etching techniques. In some embodiments, the etched regions used for the photodetectors 120 and the etched regions used for the modulators 122 may be formed using one or more of the same photolithography or etching steps. The silicon of the etched regions may be doped with p-type dopants, n-type dopants, or a combination. In some embodiments, the etched regions used for the photodetectors 120 and the etched regions used for the modulators 122 may be implanted using one or more of the same implantation steps.

In some embodiments, one or more grating couplers 124 may be integrated with the waveguides 104, and may be formed with the waveguides 104. In some embodiments, edge couplers 144 (see FIG. 11) may be included in addition to or instead of grating couplers 124. The grating couplers 124 allow for optical signals and/or optical power to be transferred between an overlying optical fiber 150 (see FIG. 10) and the waveguides 104 of the optical interposer 100. The grating couplers 124 may be formed by, for example, partially etching regions of the waveguides 104 using acceptable photolithography and etching techniques. In some embodiments, the grating couplers 124 are formed using the same photolithography or etching steps as the waveguides 104 and/or other photonic components. In other embodiments, the grating couplers 124 are formed after the waveguides 104 and/or the other photonic components are formed.

Figure 3:
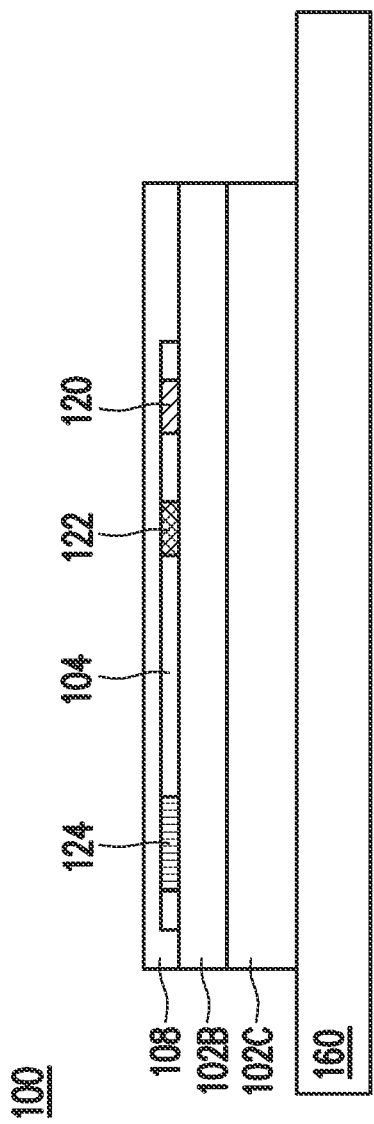

In FIG. 3, a dielectric layer 108 is formed on the front side of the BOX substrate 102, in accordance with some embodiments. The dielectric layer 108 may be formed over the waveguides 104, the photonic components, and the oxide layer 102B. The dielectric layer 108 may be formed of one or more layers of silicon oxide, silicon nitride, a combination thereof, or the like, and may be formed by CVD, PVD, atomic layer deposition (ALD), a spin-on-dielectric process, the like, or a combination thereof. In some embodiments, the dielectric layer 108 may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other dielectric materials formed by any acceptable process may be used. In some embodiments, the dielectric layer 108 is then planarized using a planarization process such as a CMP process, a grinding process, or the like. The dielectric layer 108 may be formed having a thickness over the oxide layer 102B between about 1000 μm and about 2000 μm, or may be formed having a thickness over the waveguides 104 between about 800 μm and about 1800 μm, in some embodiments. These thicknesses are examples, and other values are possible and considered within the scope of this disclosure.

Due to the difference in refractive indices of the materials of the waveguides 104 and dielectric layer 108, the waveguides 104 have high internal reflections such that light is substantially confined within the waveguides 104, depending on the wavelength of the light and the refractive indices of the respective materials. In an embodiment, the refractive index of the material of the waveguides 104 is higher than the refractive index of the material of the dielectric layer 108. For example, the waveguides 104 may comprise silicon, and the dielectric layer 108 may comprise silicon oxide and/or silicon nitride.

Figure 4:
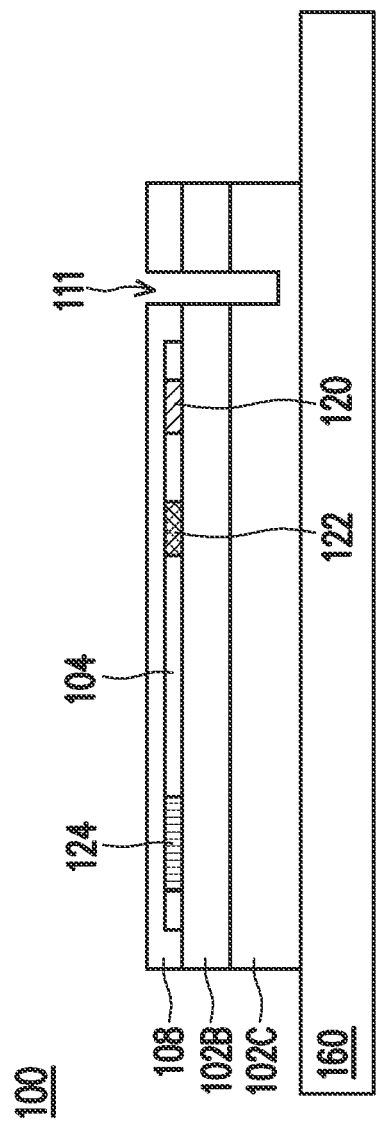

In FIG. 4, one or more openings 111 are formed extending into the substrate 102C, in accordance with some embodiments. The openings 111 are formed extending through the dielectric layer 108 and the oxide layer 102B, and extend partially into the substrate 102C. The openings 111 may be formed by acceptable photolithography and etching techniques, such as by forming and patterning a photoresist and then performing an etching process using the patterned photoresist as an etching mask. The etching process may include, for example, a dry etching process and/or a wet etching process.

In FIG. 5, a conductive material is formed in the openings 111, thereby forming vias 112, in accordance with some embodiments. In some embodiments, a liner (not shown), such as a diffusion barrier layer, an adhesion layer, or the like, may be formed in the openings 111 from TaN, Ta, TiN, Ti, CoW, the like, or combinations thereof, and may be formed using suitable a deposition process such as ALD or the like. In some embodiments, a seed layer (not shown), which may include copper or a copper alloy may then be deposited in the openings 111. The conductive material of the vias 112 is formed in the openings 111 using, for example, ECP or electro-less plating. The conductive material may include, for example, a metal or a metal alloy such as copper, silver, gold, tungsten, cobalt, aluminum, alloys thereof, the like, or combinations thereof. A planarization process (e.g., a CMP process or a grinding process) may be performed to remove excess conductive material along the top surface of the dielectric layer 108, such that top surfaces of the vias 112 and the dielectric layer 108 are level.

FIG. 5 also shows the formation of contacts 113 that extend through the dielectric layer 108 and are electrically connected to the photodetectors 120 and the modulators 122. The contacts 113 may be formed before or after formation of the vias 112, and the formation of the contacts 113 and the formation of the vias 112 may share some steps such as deposition of the conductive material and/or planarization. In some embodiments, the contact may be formed by a damascene process, e.g., single damascene, dual damascene, or the like. For example, in some embodiments, openings (not shown) for the contacts 113 are first formed in the dielectric layer 108 using acceptable photolithography and etching techniques. A conductive material may then be formed in the openings, forming the contacts 113. Excess conductive material may be removed using a CMP process or the like. The conductive material of the contacts 113 may be formed of a metal or a metal alloy including aluminum, copper, tungsten, or the like, which may be the same as that of the vias 112. The contacts 113 may be formed using other techniques or materials in other embodiments.

In FIG. 6, a passivation layer 114 and contact pads 116 are formed over the dielectric layer 108, in accordance with some embodiments. The contact pads 116 allow for electrical connections to be made to the contacts 113 and vias 112. The passivation layer 114 may comprise one or more dielectric materials similar to those described above for the dielectric layer 108, such as a silicon oxide or a silicon nitride or the like, or may comprise a different material. The passivation layer 114 may be formed using a technique similar to those described above for the dielectric layer 108 or using a different technique. The contact pads 116 may be formed using a suitable process, such as a damascene process, e.g., single damascene, duel damascene, or the like. A planarization process (e.g., a CMP process or the like) may be performed after forming the contact pads 116 such that surfaces of the contact pads 116 and the passivation layer 114 are substantially coplanar. In some embodiments, additional layers comprising conductive lines and vias (e.g., redistribution layers or the like) may be formed between the contacts 113/vias 112 and the contact pads 116 to provide additional electrical routing.

Figure 7:
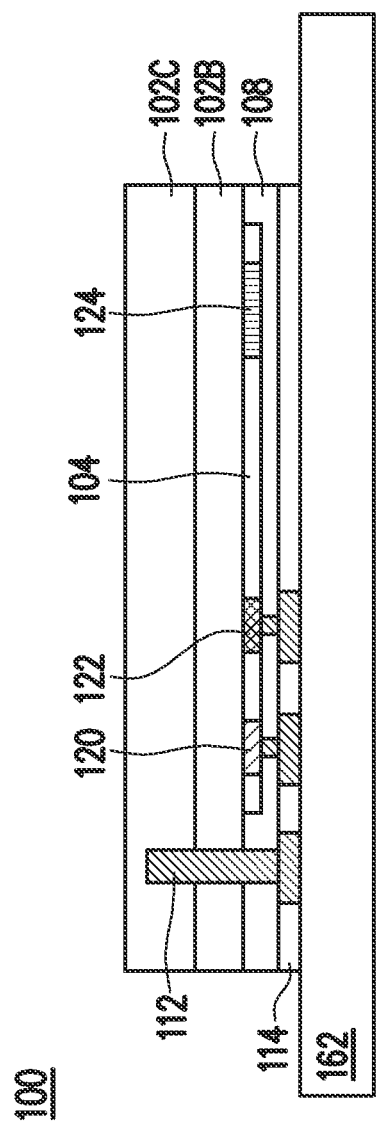
Figure 8:
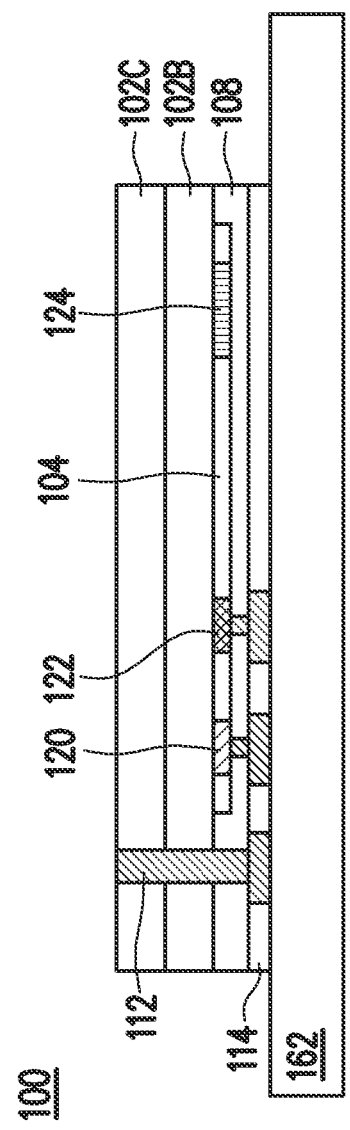

In FIG. 7, the structure is debonded from the first carrier substrate 160, flipped over, and attached to a second carrier substrate 162, in accordance with some embodiments. The second carrier substrate 162 may be a glass carrier substrate, a ceramic carrier substrate, a wafer (e.g., a silicon wafer), or the like. An adhesive layer or a release layer (not shown in FIG. 7) may be formed on the second carrier substrate 162 to facilitate the attaching of the structure. In FIG. 8, the back side of the substrate 102C is thinned to expose the vias 112, in accordance with some embodiments. The substrate 102C may be thinned by a CMP process, a mechanical grinding process, or the like.

Figure 9:
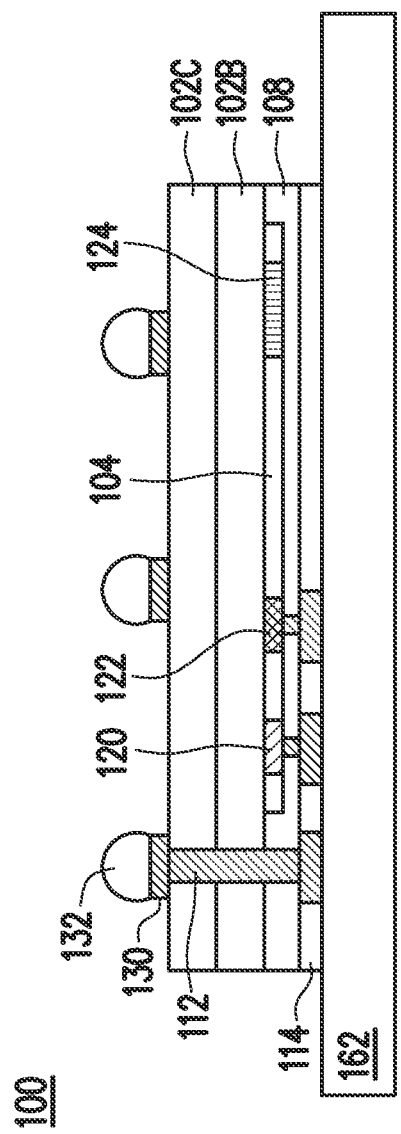

In FIG. 9, conductive pads 130 and conductive connectors 132 are formed, in accordance with some embodiments. The conductive pads 130 are formed on the exposed vias 112 and on the substrate 102C, in accordance with some embodiments. The conductive pads 130 may be conductive pads or conductive pillars that are electrically connected to the vias 112. The conductive pads 130 may be formed from conductive materials such as copper, another metal or metal alloy, the like, or combinations thereof. The material of the conductive pads 130 may be formed by a suitable process, such as plating. For example, in some embodiments, the conductive pads 130 are metal pillars (such as copper pillars) formed by a sputtering, printing, electro plating, electroless plating, CVD, or the like. The metal pillars may be solder free and have substantially vertical sidewalls. In some embodiments, a metal cap layer (not shown) is formed on the top of the conductive pads 130. The metal cap layer may include nickel, tin, tin-lead, gold, silver, palladium, indium, nickel-palladium-gold, nickel-gold, the like, or a combination thereof and may be formed by a plating process. In some embodiments, underbump metallizations (UBMs, not shown) may be formed over the conductive pads 130. In some embodiments, a passivation layer (not shown) such as a silicon oxide or silicon nitride may be formed over the substrate 102C to surround or partially cover the conductive pads 130.

The conductive connectors 132 may then be formed on the conductive pads 130, in accordance with some embodiments. In other embodiments, conductive connectors 132 are not formed on the conductive pads 130. The conductive connectors 132 may be, for example, ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 132 may include a conductive material such as solder, copper, aluminum, gold, nickel, silver, palladium, tin, the like, or a combination thereof. In some embodiments, the conductive connectors 132 are formed by initially forming a layer of solder through evaporation, electroplating, printing, solder transfer, ball placement, or the like. Once a layer of solder has been formed on the structure, a reflow may be performed in order to shape the material into the desired bump shapes. In some embodiments, conductive connectors 132 are not formed on the conductive pads 130 prior to making electrical connection with an external component (e.g., the interconnect substrate 302 shown in FIG. 19).

Figure 10:
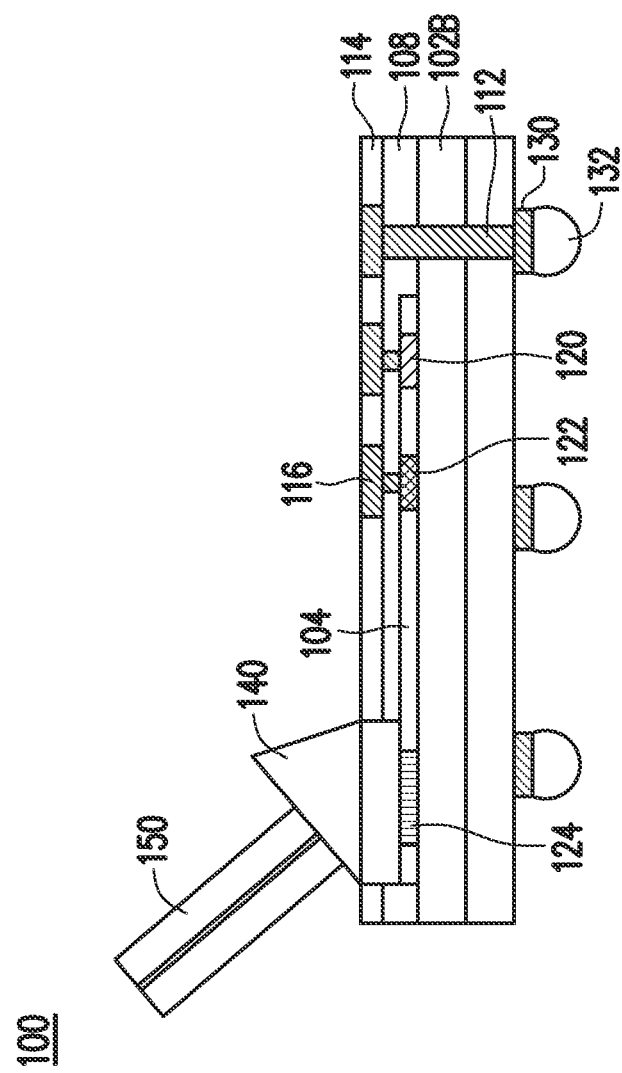
FIG. 10 shows a cross-sectional view of an optical interposer having a grating coupler that is coupled to an optical fiber, in accordance with some embodiments.
Figure 11:
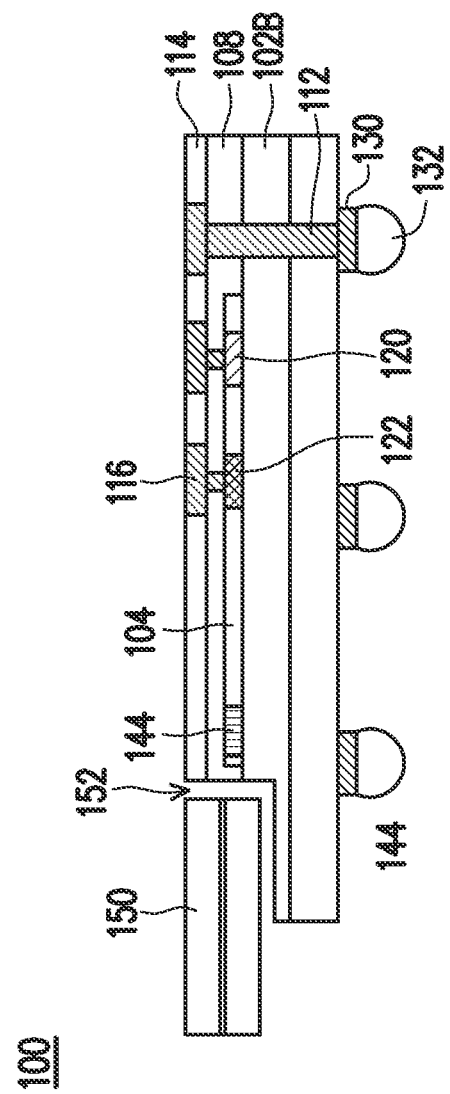
FIG. 11 shows a cross-sectional view of an optical interposer having an edge coupler that is coupled to an optical fiber, in accordance with some embodiments.

FIGS. 10 and 11 illustrate optical interposers 100, in accordance with some embodiments. FIG. 10 illustrates an optical interposer 100 in which an optical fiber 150 is attached to the optical interposer 100 such that the optical fiber 150 is optically coupled to a grating coupler 124. The grating coupler 124 facilitates transmission of optical signals or optical power between the optical fiber 150 and one or more waveguides 104. The optical fiber 150 may be attached to the optical interposer by a reflector 140, which may include optical components (e.g., lenses, mirrors, gratings, prisms, or the like) to facilitate the transmission of optical signals or optical power between the optical fiber 150 and the grating coupler 124. In some embodiments, an optical glue is used to attach the optical fiber 150 and/or the reflector 140 to the optical interposer 100. In some embodiments, regions of the passivation layer 114 and/or the dielectric layer 108 over the grating couplers 124 may be recessed or removed prior to attaching the optical fiber 150 and/or the reflector 140. The regions of the passivation layer 114 and/or dielectric layer 108 may be recessed or removed using, for example, a suitable photolithography and etching process. Recessing or removing material above a grating coupler 124 may allow for more efficient optical coupling between the grating coupler 124 and an optical fiber 150 and/or a reflector 140.

The optical interposer 100 shown in FIG. 11 is similar to the optical interposer 100 shown in FIG. 10, except that the optical fiber 150 is attached to the optical interposer 100 such that the optical fiber 150 is optically coupled to an edge coupler 144. The edge coupler 144 facilitates transmission of optical signals or optical power between the optical fiber 150 and one or more waveguides 104. In some embodiments, regions of the passivation layer 114 and/or the dielectric layer 108 adjacent the edge coupler 144 may be recessed or removed to form a recess 152 in which the optical fiber 150 is attached. The recess 152 may be, for example, a trench, groove (e.g., a "v-groove"), or the like that helps to secure the optical fiber 150 and aligns the optical fiber 150 with the edge coupler 144. In some embodiments, an optical glue is used to attach the optical fiber 150 to the optical interposer 100 within the recess 152.

Figure 12:
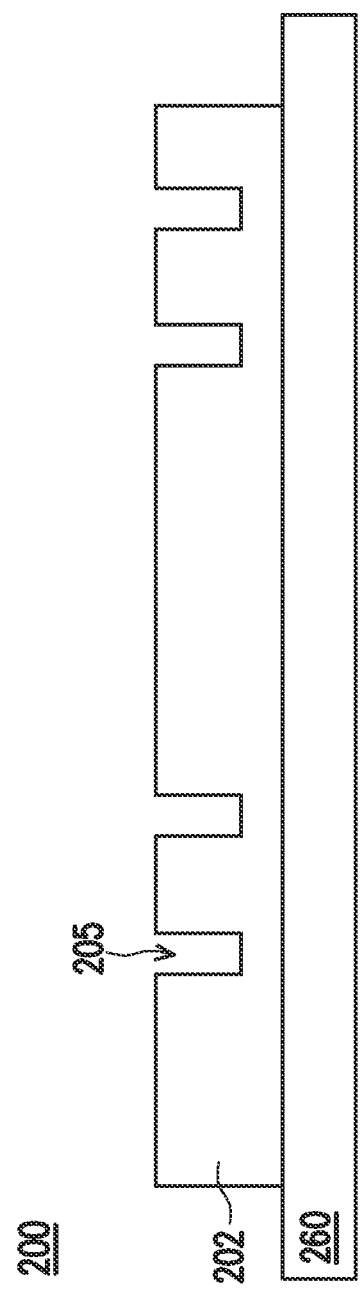
FIGS. 12 through 18 show cross-sectional views of intermediate steps of forming an electrical interposer, in accordance with some embodiments.

FIGS. 12 through 18 show cross-sectional views of intermediate steps of forming an electrical interposer 200 (see FIG. 18), in accordance with some embodiments. In some embodiments, the electrical interposer 200 includes conductive routing that provides electrical interconnection between components in a computing system (e.g., the computing system 300 of FIG. 19). Turning first to FIG. 12, a substrate 202 is attached to a second carrier substrate 260, in accordance with some embodiments. The second carrier substrate 260 may be, for example, a wafer (e.g., a silicon wafer), a panel, a glass substrate, a ceramic substrate, or the like. The substrate 202 may be attached to the second carrier substrate 260 using, for example, an adhesive or a release layer (not shown).

The substrate 202 may be, for example, a material such as a glass, ceramic, dielectric, a semiconductor, the like, or a combination thereof. In some embodiments, the substrate 202 may be a semiconductor substrate, such as a bulk semiconductor or the like, which may be doped (e.g., with a p-type or an n-type dopant) or undoped. The substrate 202 may be a wafer, such as a silicon wafer (e.g., a 12-inch silicon wafer). Other substrates, such as a multi-layered or gradient substrate may also be used. In some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; the like, or combinations thereof. The substrate 202 may be referred to as having a front side or front surface (e.g., the side facing upwards in FIG. 12), and a back side or back surface (e.g., the side facing downwards in FIG. 12, which is attached to the second carrier substrate 260). In some embodiments, the substrate 202 is free of active and/or passive devices. In other embodiments, the substrate 202 includes active and/or passive devices.

FIG. 12 also illustrates one or more openings 205 formed extending into the substrate 202, in accordance with some embodiments. The openings 205 may extend partially into the substrate 202. The openings 205 may be formed by acceptable photolithography and etching techniques, such as by forming and patterning a photoresist and then performing an etching process using the patterned photoresist as an etching mask. The etching process may include, for example, a dry etching process and/or a wet etching process.

Figure 13:
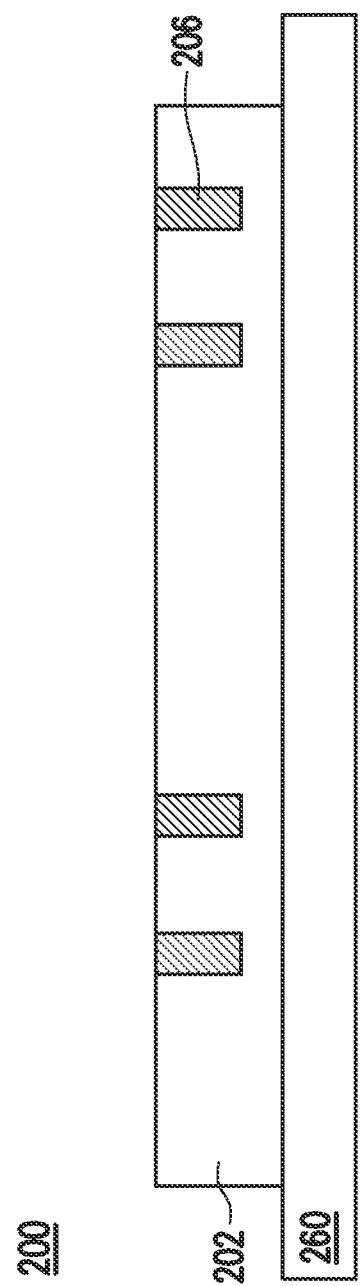

In FIG. 13, a conductive material is formed in the openings 205, thereby forming vias 206, in accordance with some embodiments. In some embodiments, a liner (not shown), such as a diffusion barrier layer, an adhesion layer, or the like, may be formed in the openings 205 from TaN, Ta, TiN, Ti, CoW, the like, or combinations thereof, and may be formed using suitable a deposition process such as ALD or the like. In some embodiments, a seed layer (not shown), which may include copper or a copper alloy may then be deposited in the openings 205. The conductive material of the vias 206 is formed in the openings 205 using, for example, ECP, electro-less plating, or the like. The conductive material may include, for example, a metal or a metal alloy such as copper, silver, gold, tungsten, cobalt, aluminum, alloys thereof, the like, or combinations thereof. A planarization process (e.g., a CMP process or a grinding process) may be performed to remove excess conductive material along the top surface of the substrate 202, such that top surfaces of the vias 206 and the substrate 202 are level.

Figure 14:
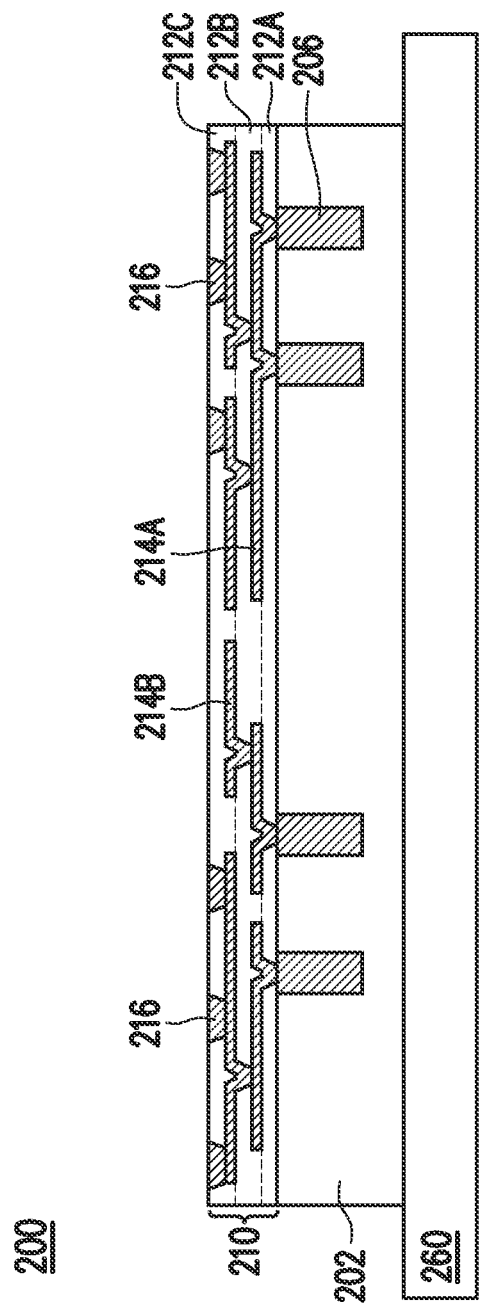

In FIG. 14, a first interconnect structure 210 is formed over the substrate 202 and over the vias 206. In the embodiment shown, the first interconnect structure 210 includes dielectric layers 212A-C, metallization patterns 214A-B (sometimes referred to as redistribution layers or redistribution lines), and pads 216. The first interconnect structure 210 is shown as an illustrative example having two layers of metallization patterns (214A and 214B), but the first interconnect structure 210 may have more or fewer dielectric layers and metallization patterns than shown. If fewer dielectric layers and metallization patterns are to be formed, steps and process discussed below may be omitted. If more dielectric layers and metallization patterns are to be formed, steps and processes discussed below may be repeated.

The dielectric layer 212A is first deposited on the substrate 202 and the vias 206. In some embodiments, the dielectric layer 212A is formed of a polymer material, such as polybenzoxazole (PBO), polyimide, benzocyclobutene (BCB), or the like. In other embodiments, the dielectric layer 212A is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 212A may be formed by any acceptable deposition process, such as spin coating, CVD, ALD, laminating, the like, or a combination thereof. The dielectric layer 212A is then patterned to expose portions of the through vias 206. The patterning may be performed using an acceptable process, such as by exposing the dielectric layer 212A to light when the dielectric layer 212A is a photo-sensitive material or by etching using, for example, an anisotropic etch. If the dielectric layer 212A is a photo-sensitive material, the dielectric layer 212A can be developed after the exposure.

The metallization pattern 214A may then be formed on the dielectric layer 212A. The metallization pattern 214A includes line portions (also referred to as conductive lines) on and extending along the major surface of the dielectric layer 212A. The metallization pattern 214A further includes via portions (also referred to as conductive vias) extending through the dielectric layer 212A to physically and electrically couple the vias 206. As an example to form metallization pattern 214A, a seed layer is formed over the dielectric layer 212A. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 214A. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 214A.

The dielectric layer 212B is then deposited on the metallization pattern 214A and dielectric layer 212A. The dielectric layer 212B may be formed in a manner similar to the dielectric layer 212A, and may be formed of a similar material as the dielectric layer 212A. The metallization pattern 214B is then formed. The metallization pattern 214B includes line portions on and extending along the major surface of the dielectric layer 212B. The metallization pattern 214B further includes via portions extending through the dielectric layer 212B to physically and electrically couple the metallization pattern 214A. The metallization pattern 214B may be formed in a similar manner and of a similar material as the metallization pattern 214A.

In some embodiments, different metallization patterns of the first interconnect structure 210 have a different size than other metallization patterns of the first interconnect structure 210. For example, the conductive lines and/or vias of the metallization pattern 214B may be wider or thicker than the conductive lines and/or vias of the metallization pattern 214A. Further, the metallization pattern 214B may be formed to a greater pitch than the metallization pattern 214A. The metallization pattern 214B is the topmost metallization pattern of the first interconnect structure 210. As such, all of the intermediate metallization patterns of the first interconnect structure 210 (e.g., the metallization pattern 214A) are disposed between the metallization pattern 214B and the substrate 202.

The dielectric layer 212C is deposited on the metallization pattern 214B and the dielectric layer 212B. The dielectric layer 212C may be formed in a manner similar to the dielectric layer 212A or 212B, and may be formed of the same material as the dielectric layer 212A or 212B. The dielectric layer 212C is the topmost dielectric layer of the first interconnect structure 210. As such, all of the metallization patterns of the first interconnect structure 210 (e.g., the metallization patterns 214A-B) are disposed between the dielectric layer 212C and the substrate 202. Further, all of the intermediate dielectric layers of the first interconnect structure 210 (e.g., the dielectric layers 212A-B) are disposed between the dielectric layer 212C and the substrate 202.

It should be appreciated that the first interconnect structure 210 may include any number of dielectric layers and metallization patterns. If more dielectric layers and metallization patterns are to be formed, steps and processes similar to those discussed above may be repeated. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines. In other embodiments, the metallization patterns of the first interconnect structure 210 may be formed using a different process than described above, such as by using a damascene process, e.g., dual damascene, single damascene, or the like.

Still referring to FIG. 14, pads 216 are formed for external electrical connection to the first interconnect structure 210, in accordance with some embodiments. In an example of forming the pads 216, the topmost dielectric layer 212C is first patterned to form openings exposing portions of the topmost metallization pattern 214B. The patterning may be performed using an acceptable process, such as by exposing the dielectric layer 212C to light when the dielectric layer 212C is a photo-sensitive material or by etching using, for example, an anisotropic etch. If the dielectric layer 212C is a photo-sensitive material, the dielectric layer 212C can be developed after the exposure.

The pads 216 may be formed of a conductive material, such as the same material as the metallization patterns 214A-B, and may be formed using a similar process as the metallization patterns 214A-B (e.g., plating). The pads 216 may have via portions extending through the topmost dielectric layer 212C to physically and electrically couple the topmost metallization pattern 214B. In some embodiments, the pads 216 have portions on and extending along the major surface of the dielectric layer 212C. In some embodiments, the pads 216 have a different size (e.g., width, thickness, etc.) than the metallization patterns 214A-B. A planarization process (e.g., a CMP process or the like) may be performed after forming the pads 216 such that surfaces of the pads 216 and the topmost dielectric layer 212C are substantially coplanar. In some embodiments, the pads 216 may include microbumps, conductive pads, underbump metallization structures (UBMs), solder connectors, and/or the like.

Figure 15:
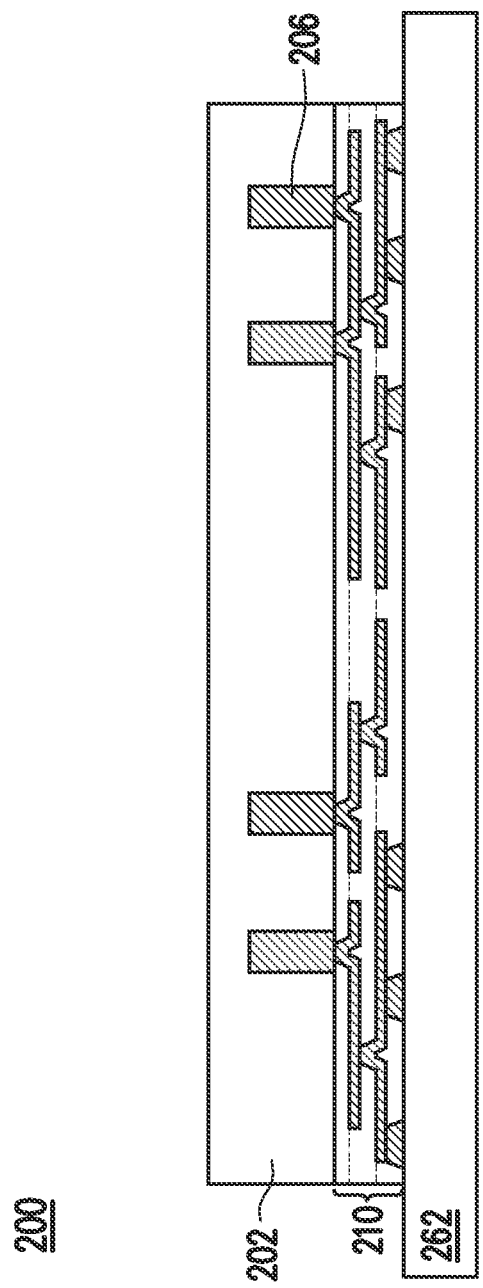

In FIG. 15, the structure is debonded from the second carrier substrate 260, flipped over, and attached to a third carrier substrate 262. The third carrier substrate 262 may be a glass carrier substrate, a ceramic carrier substrate, a wafer (e.g., a silicon wafer), or the like. An adhesive layer or a release layer (not shown in FIG. 15) may be formed on the third carrier substrate 262 to facilitate the attaching of the structure.

Figure 16:
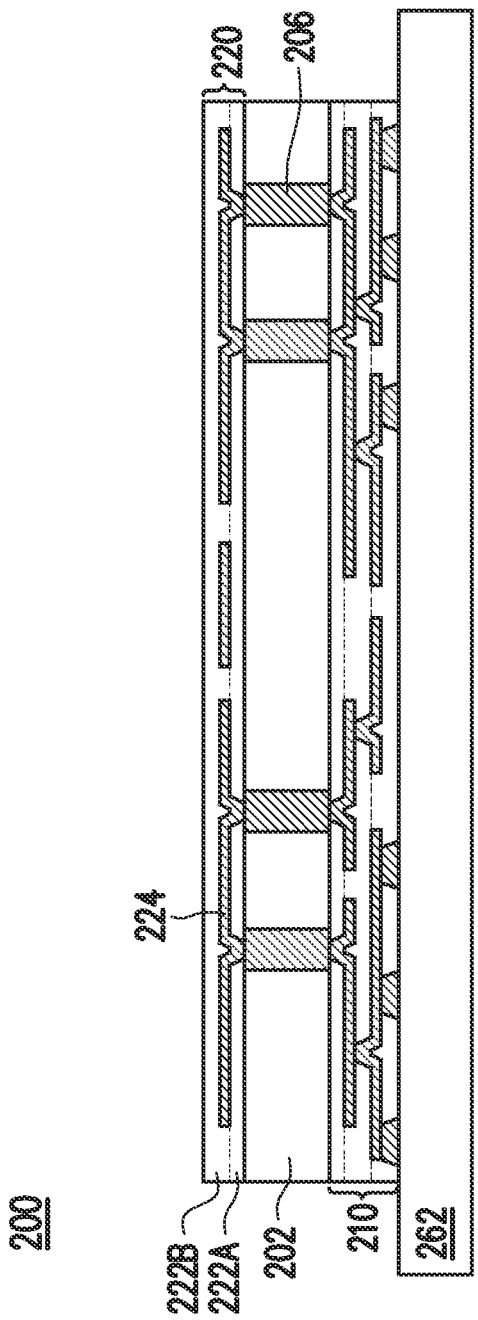

In FIG. 16, the back side of the substrate 202 is thinned to expose the vias 206, and an optional second interconnect structure 220 is formed, in accordance with some embodiments. The substrate 202 may be thinned by a CMP process, a mechanical grinding process, or the like. In the embodiment shown, the second interconnect structure 220 includes dielectric layers 222A-B and metallization pattern 224. The second interconnect structure 220 may have more or fewer dielectric layers and metallization patterns than shown. The second interconnect structure 220 is optional. In some embodiments, a dielectric layer without metallization patterns is formed in lieu of the second interconnect structure 220.

In some embodiments, the dielectric layer 222A is first deposited on the back side of the substrate 202 and on the vias 206. The dielectric layer 222A may be formed of a material similar to any of the dielectric layers 212A-C of the first interconnect structure 210, and may be formed in a manner similar to the dielectric layers 212A-C. The metallization pattern 224 is then formed. The metallization pattern 224 includes line portions on and extending along the major surface of the dielectric layer 222A. The metallization pattern 224 further includes via portions extending through the dielectric layer 222A to physically and electrically couple the vias 206. The metallization pattern 224 may be formed in a similar manner and of a similar material as any of the metallization patterns 214A-B. The dielectric layer 222B is then deposited on the metallization pattern 224 and the dielectric layer 222A. The dielectric layer 240 may be formed in a manner similar to the dielectric layer 222A, and may be formed of the same material as the dielectric layer 222A.

Figure 17:
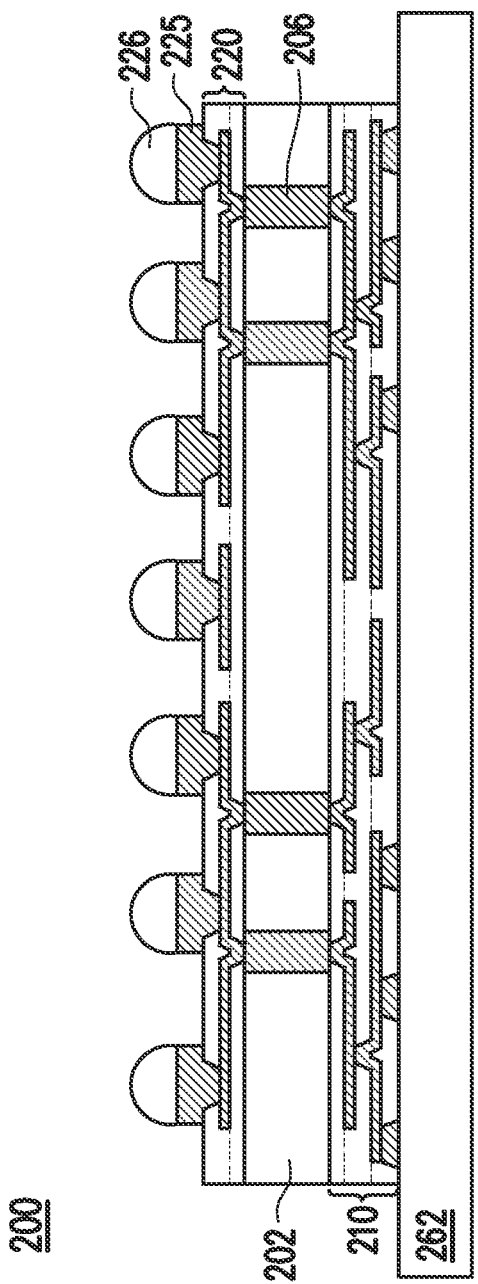
Figure 18:
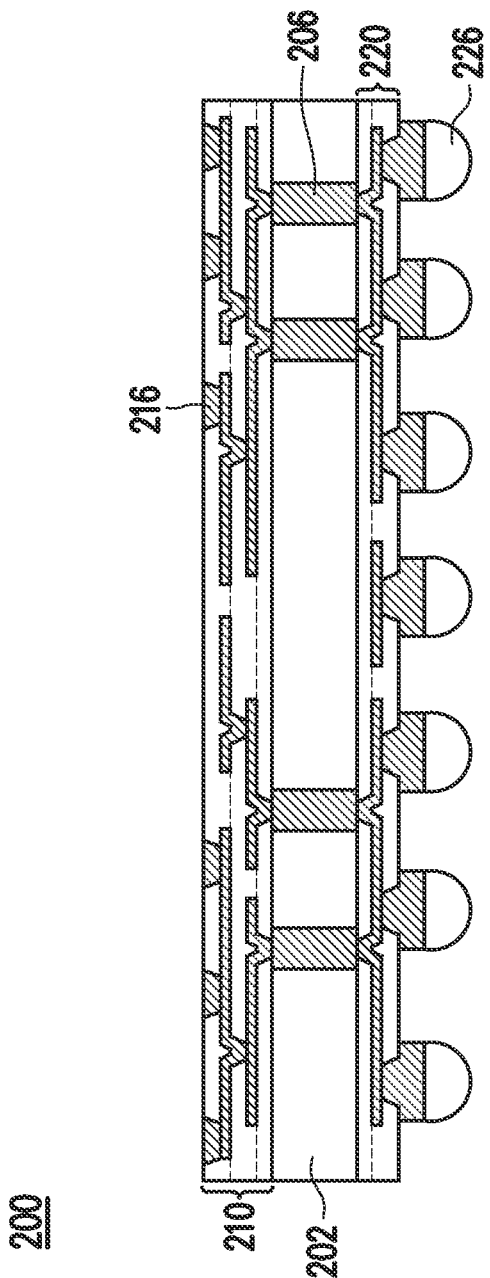

In FIG. 17, UBMs 225 and conductive connectors 226 are formed for making electrical connection to the second interconnect structure 220, in accordance with some embodiments. In FIG. 18, the structure is debonded from the third carrier substrate 262, forming an electrical interposer 200. The UBMs 225 may have bump portions on and extending along the major surface of the dielectric layer 222B, and may have via portions extending through the dielectric layer 222B to physically and electrically couple the metallization pattern 224. The UBMs 225 may be formed of the same material as the metallization pattern 224. In some embodiments, the UBMs 225 have a different size than the metallization pattern 224.

Conductive connectors 226 may be formed on the UBMs 225. The conductive connectors 226 may be similar to the conductive connectors 132 described previously for FIG. 9. For example, the conductive connectors 226 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 226 may include a conductive material such as solder, copper, aluminum, gold, nickel, silver, palladium, tin, the like, or a combination thereof. In some embodiments, the conductive connectors 226 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 226 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, conductive connectors 226 are not formed on the UBMs 225 prior to making electrical connection with an external component (e.g., the interconnect substrate 302 shown in FIG. 19).

Figure 19:
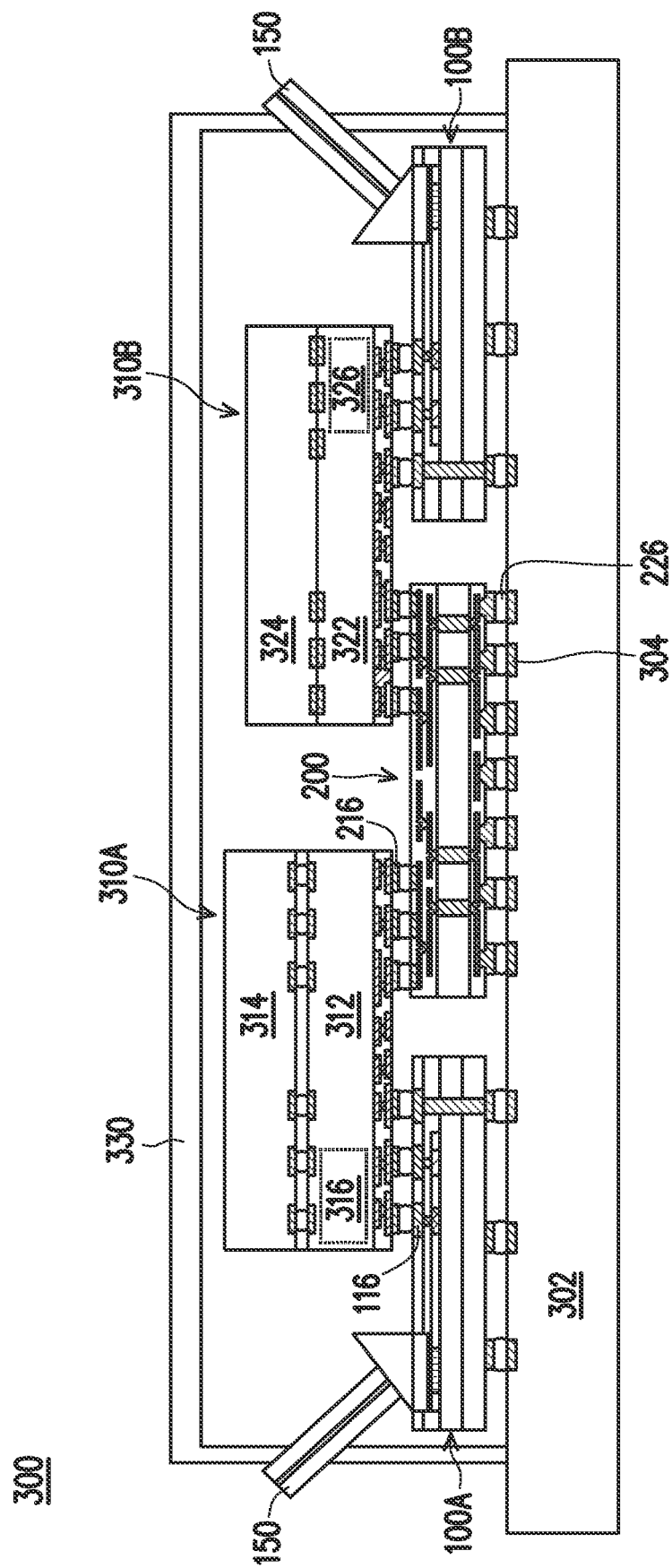
FIG. 19 shows a cross-sectional view of a computing system, in accordance with some embodiments.

FIG. 19 illustrates a computing system 300, in accordance with some embodiments. The computing system 300 includes one or more optical interposers 100 and one or more electrical interposers 200 attached to an interconnect substrate 302 (also called a "package substrate"), and one or more semiconductor devices 310 connected to one or more of the optical interposers 100 and/or one or more of the electrical interposers 200. For example, the semiconductor device 310A shown in FIG. 19 is electrically connected to an optical interposer 10A and to an electrical interposer 200, and the semiconductor device 310B is electrically connected to an optical interposer 100B and to the electrical interposer 200. By using the optical interposers 100 described herein, high bandwidth communications using optical interconnects can be enabled within a computing system 300, and the size and/or power consumption of a computing system 300 can be reduced. The optical interposers 100 may communicate with an optical network or external optically-connected components using one or more optical fibers 150. The use of electrical interposers 200 described herein allow for electrical communications between semiconductor devices 310 of a computing system 300. A computing system 300 may include more or fewer components than shown in FIG. 19. The optical interposers 100 and electrical interposers 200 may be arranged in any suitable configuration within a computing system 300, allowing for flexible design and the formation of optically connected computing systems of larger size. In some embodiments, a computing system 300 includes an optional heat spreader 330 that can facilitate heat dissipation. These and other configurations are considered within the scope of the present disclosure.

The computing system 300 shown in FIG. 19 includes two semiconductor devices 310A-B, though in other embodiments a computing system 300 may include more or fewer devices and/or devices of different types than these. The semiconductor devices 310 of a computing system 300 may include similar devices, different devices, or a combination thereof. A semiconductor device 310 may include, for example, a central processing unit (CPU), a graphics processing unit (GPU), an application-specific integrated circuit (ASIC), a high performance computing (HPC) die, a field-programmable gate array (FPGA), a machine learning (ML) device such as a ML accelerator (sometimes called an artificial intelligence (AI) accelerator), the like, or a combination thereof. A semiconductor device 310 may include a memory device, such as, for example, a volatile memory such as dynamic random-access memory (DRAM), static random-access memory (SRAM), another type of memory, or the like. In some embodiments, processing and memory functionality may be integrated within the same semiconductor device 310. The semiconductor devices 310 may include system-on-chip (SoC) devices, system-on-integrated-circuit (SoIC) devices, "chiplets," the like, or a combination thereof.

In some embodiments, one or more of the semiconductor devices 310 of a computing system 300 may include multiple semiconductor dies bonded together. For example, the semiconductor device 310A shown in FIG. 19 includes a semiconductor die 312 bonded to a semiconductor die 314 by conductive connectors (e.g., solder bumps or the like). As another example, the semiconductor device 310B includes a semiconductor die 322 bonded to a semiconductor die 324 by dielectric-to-dielectric bonding and/or metal-to-metal bonding (e.g., direct bonding, fusion bonding, oxide-to-oxide bonding, hybrid bonding, or the like). A semiconductor device 310 may include one, two, or more than two semiconductor dies.

In some embodiments, a semiconductor device 310 includes circuits (e.g., integrated circuits and associated components) configured to interface with the photonic components (e.g., photodetectors 120 or optical modulators 122) of one or more optical interposers 100. These circuits may be referred to as "interface circuits" herein. For example, the semiconductor device 310A includes interface circuits 316 that are configured to interface with the optical interposer 10A, and the semiconductor device 310B includes interface circuits 326 that are configured to interface with the optical interposer 10B. The interface circuits of a semiconductor device 310 may be located relatively close to the corresponding optical interposer 100, such as directly over the optical interposer 100. The interface circuits of a semiconductor device 310 may include, for example, controllers, drivers, transimpedance amplifiers, the like, or combinations thereof. The interface circuits may include circuits for processing electrical signals received from photonic components, such as for processing electrical signals received from a photodetector 120, and may provide Serializer/Deserializer (SerDes) functionality. The interface circuits may include circuits for controlling high-frequency signaling of the photonic components, such as for controlling the modulation of an optical modulator 122. In some embodiments, the interface circuits may be incorporated within a separate device such as electronic integrated circuit (EIC) chip or the like that is bonded to a semiconductor device 310.

The interconnect substrate 302 may be for example, a glass substrate, a ceramic substrate, a dielectric substrate, an organic substrate (e.g., an organic core), a semiconductor substrate (e.g., a semiconductor wafer), the like, or a combination thereof. In some embodiments, the interconnect substrate 302 includes conductive pads 304 and conductive routing (e.g., conductive lines, vias, redistribution structures, or the like). The interconnect substrate 302 may be free of active or passive devices. The interconnect substrate 302 may include passive or active devices, in other embodiments. In some embodiments, the interconnect substrate 302 may be another type of structure, such as an integrated fan-out structure, a redistribution structure, or the like.

The conductive connectors 132 of the optical interposers 100 and the conductive connectors 226 of the electrical interposers 200 may be electrically connected to the conductive pads 304 of the interconnect substrate 302. One or more semiconductor devices 310 may then be electrically connected to the contact pads 116 of optical interposers 100 and/or to the pads 216 of electrical interposers 200 by conductive connectors (e.g., solder bumps or the like). In some embodiments, one or more semiconductor devices 310 may also be directly connected to the conductive pads 304 of the interconnect substrate 302. In some embodiments, an underfill material or the like (not shown in the figures) may be formed around, between, or under the optical interposers 100, the electrical interposers 200, and/or the semiconductor devices 310.

In some embodiments, an optical interposer 100 of the computing system 300 receives external optical signals from an optical fiber 150 which are detected using the photodetector 120 of the optical interposer 100. Corresponding electrical signals may then be transmitted from the photodetector 120 to a semiconductor device 310 connected to the optical interposer. The semiconductor device 310 may then process the electrical signals or provide other appropriate computing functionality. In some embodiments, the semiconductor device 310 generates electrical signals that may be transmitted to the modulator 122 of the optical interposer 100. The modulator 122 generates corresponding optical signals which may be transmitted externally by the optical fiber 150. Use of optical interposers 100 in this manner may reduce the size, power consumption, cost, or latency of a computing system 300 while providing high-speed optical communication with external optical components.

Figure 20:
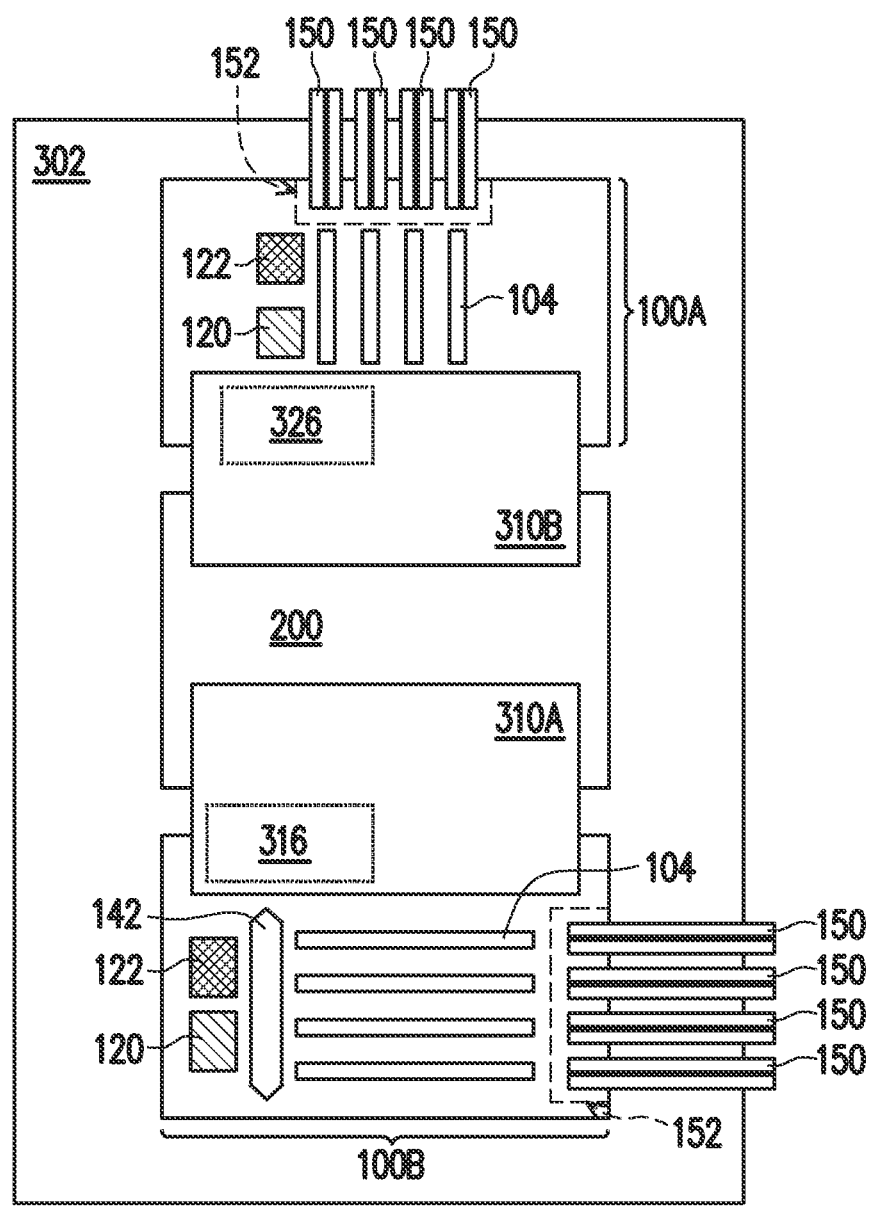
FIG. 20 shows a plan view of a computing system, in accordance with some embodiments.

FIG. 20 shows a plan view of a computing system 300, in accordance with some embodiments. The computing system 300 is similar to that shown in FIG. 19, except that the optical interposers 10A and 10B are each coupled to multiple optical fibers 150. Additionally, the optical interposer 100A has optical fibers 150 arranged in a different orientation than the optical interposer 100B, as an example illustrating how the optical fibers 150 and optical interposers 100 may have different configurations within a computing system 300. The relative sizes, shapes, or numbers of the optical interposers 100, electrical interposers 200, or semiconductor devices 310 may be different than shown in FIG. 20. The components of the computing system 300 may also have a different arrangement than shown in FIG. 20.

The optical interposers 100 shown in FIG. 20 each includes optical fibers 150 that are mounted within one or more recesses 152, similar to the optical interposer 100 shown in FIG. 11. In other embodiments, one or more optical interposers 100 may have optical fibers 150 mounted in a different manner, such as that shown in FIG. 10. In some embodiments, the optical interposers 100 may include optical components 142 (e.g., lenses, mirrors, gratings, prisms, or the like) to facilitate the transmission of optical signals or optical power between the waveguides 104 and the photonic components (e.g., photodetector 120, modulator 122). As shown in FIG. 20, the use of optical interposers 100 as described herein allows for flexible design of a computing system 300. For example, the design of a computing system 300 may be optimized for a particular application.

Figure 21A:
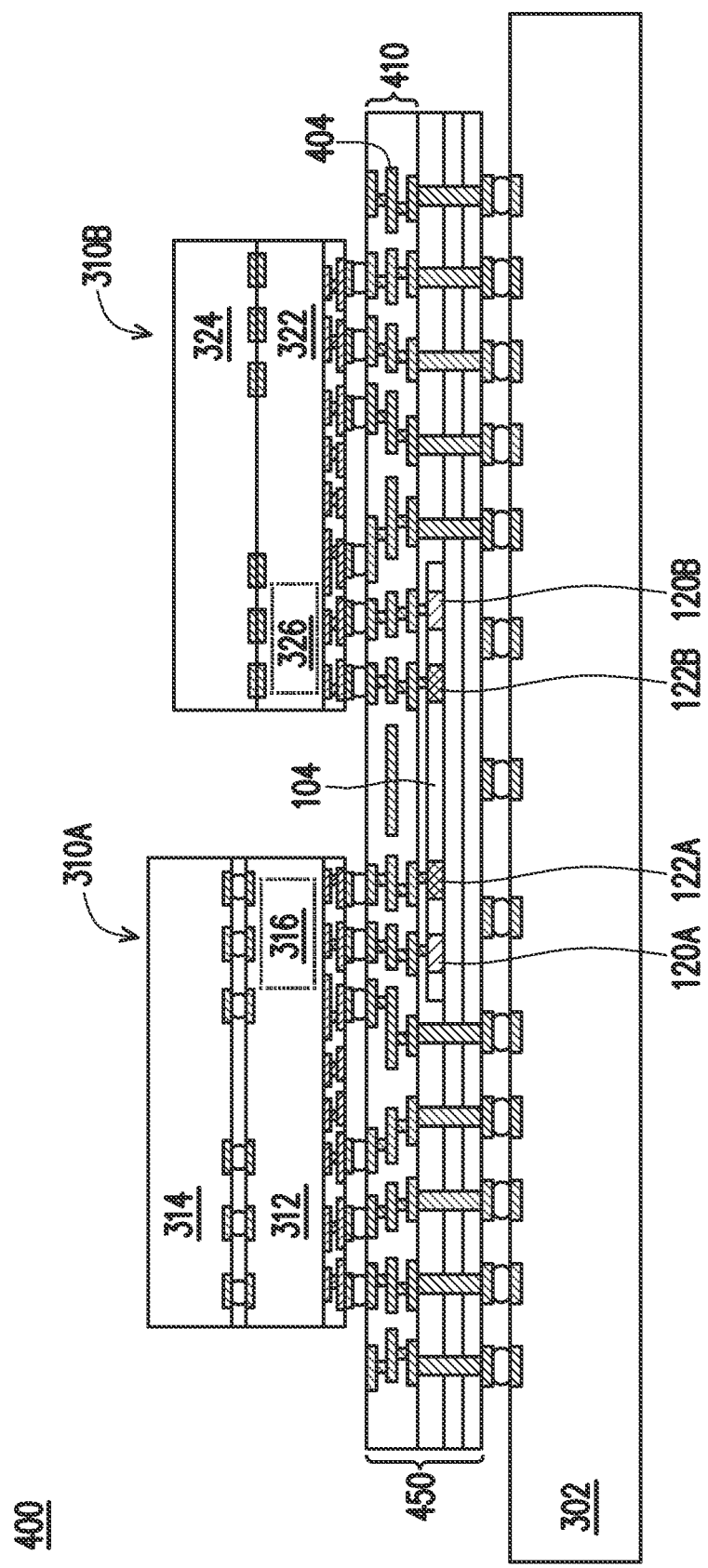

FIGS. 21A-B illustrates a cross-sectional view and a plan view of a computing system 400, in accordance with some embodiments. The computing system 400 includes an optical interposer 450 attached to an interconnect substrate 302, and one or more semiconductor devices 310 connected to the optical interposer 450. The optical interposer 450 may be similar to the optical interposer 100 described previously, except that the optical interposer 450 also includes an interconnect structure 410 comprising conductive lines 404 and other conductive features (e.g., conductive pads, vias, or the like). In some embodiments, the optical interposer 450 is formed in a similar manner as the optical interposer 100, except that the interconnect structure 410 is formed over the dielectric layer 108 as shown in FIG. 5. The interconnect structure 410 may be formed using similar techniques as described for the interconnect structure 210 shown in FIG. 14. The interconnect structure 410 provides electrical interconnection between the semiconductor devices 310 and other components of the optical interposer 450.

The optical interposer 450 includes one or more waveguides 104 that allow for optical communication between two or more semiconductor devices 310 within the computing system 400. The semiconductor devices 310 may each be connected to photonic components that facilitate communication using optical signals within the waveguides 104. For example, FIG. 21A shows semiconductor device 310A connected to photonic components 120A/122A and semiconductor device 310B connected to photonic components 120B/122B. In some embodiments, the optical interposer 450 may communicate with an optical network or external optically-connected components using one or more optical fibers 150 (not shown in FIGS. 21A-B). In some embodiments, the optical interposer 450 may include an optical power source such as a laser diode or the like.

The optical interposer 450 described herein allows for high bandwidth communications using optical interconnects within a computing system 400, which can reduce the size and/or power consumption of a computing system 400. Additionally, the interconnect structure 410 of the optical interposer 450 allows for electrical communications between semiconductor devices 310 or other components. A computing system 400 may include more or fewer components than shown in FIGS. 21A-B. In some embodiments, a computing system 400 includes an optional heat spreader that can facilitate heat dissipation. These and other configurations are considered within the scope of the present disclosure.

Figure 22A:
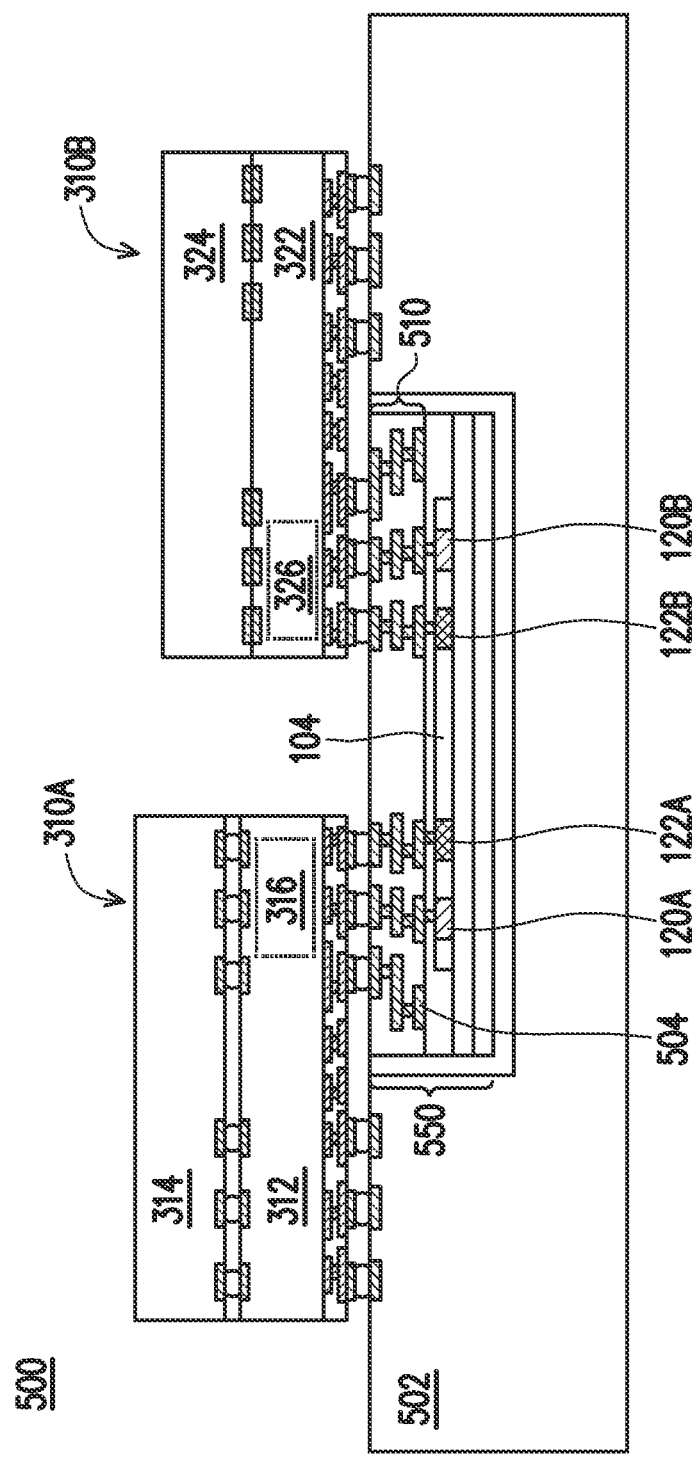

FIGS. 22A-B illustrates a cross-sectional view and a plan view of a computing system 500, in accordance with some embodiments. The computing system 500 includes an optical interposer 550 embedded within an interconnect substrate 502, and one or more semiconductor devices 310 connected to the optical interposer 550 and/or the interconnect substrate 502. The optical interposer 550 may be similar to the optical interposer 450 described previously. For example, the optical interposer 550 includes waveguides 104, photonic components (e.g., 120/122), and an interconnect structure 510 comprising conductive lines 504 and other conductive features (e.g., conductive pads, vias, or the like). In some embodiments, the optical interposer 550 is formed in a similar manner as the optical interposer 450. The interconnect structure 510 may be formed using similar techniques as described for the interconnect structure 210 shown in FIG. 14. The interconnect structure 510 provides electrical interconnection from the semiconductor devices 310 to photonic components within the optical interposer 550 and can also provide electrical interconnection between the semiconductor devices 310.

The interconnect substrate 502 may be similar to the interconnect substrate 302 described previously, except that a recess or cavity is formed within the interconnect substrate 502 within which the optical interposer 550 is placed. The recess may be formed by a suitable etching process. In some embodiments, the optical interposer 550 is attached within the recess of the interconnect substrate 502 by an adhesive. The optical interposer 550 may have a top surface below, about level with, or above a top surface of the interconnect substrate 502.

The optical interposer 550 includes one or more waveguides 104 that allow for optical communication between two or more semiconductor devices 310 within the computing system 500. The semiconductor devices 310 may each be connected to photonic components that facilitate communication using optical signals within the waveguides 104. For example, FIG. 22A shows semiconductor device 310A connected to photonic components 120A/122A and semiconductor device 310B connected to photonic components 120B/122B. In some embodiments, the optical interposer 550 may include an optical power source such as a laser diode or the like.

The optical interposer 550 described herein allows for high bandwidth communications using optical interconnects within a computing system 500, which can reduce the size and/or power consumption of a computing system 500. Additionally, the interconnect structure 510 of the optical interposer 550 allows for electrical communications between semiconductor devices 310 or other components. A computing system 500 may include more or fewer components than shown in FIGS. 22A-B. In some embodiments, a computing system 500 includes an optional heat spreader that can facilitate heat dissipation. These and other configurations are considered within the scope of the present disclosure.

Figure 23A:
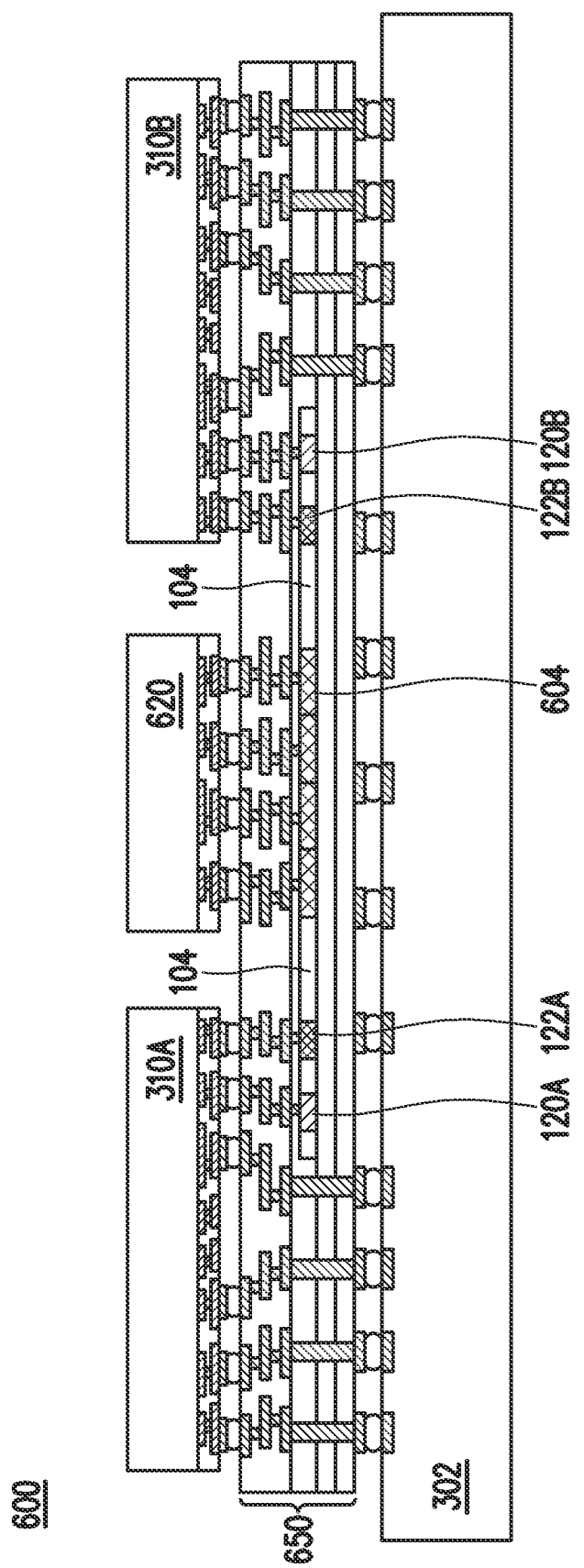
FIGS. 23A-B show a cross-sectional view and a plan view of a computing system, in accordance with some embodiments.
Figure 23B:
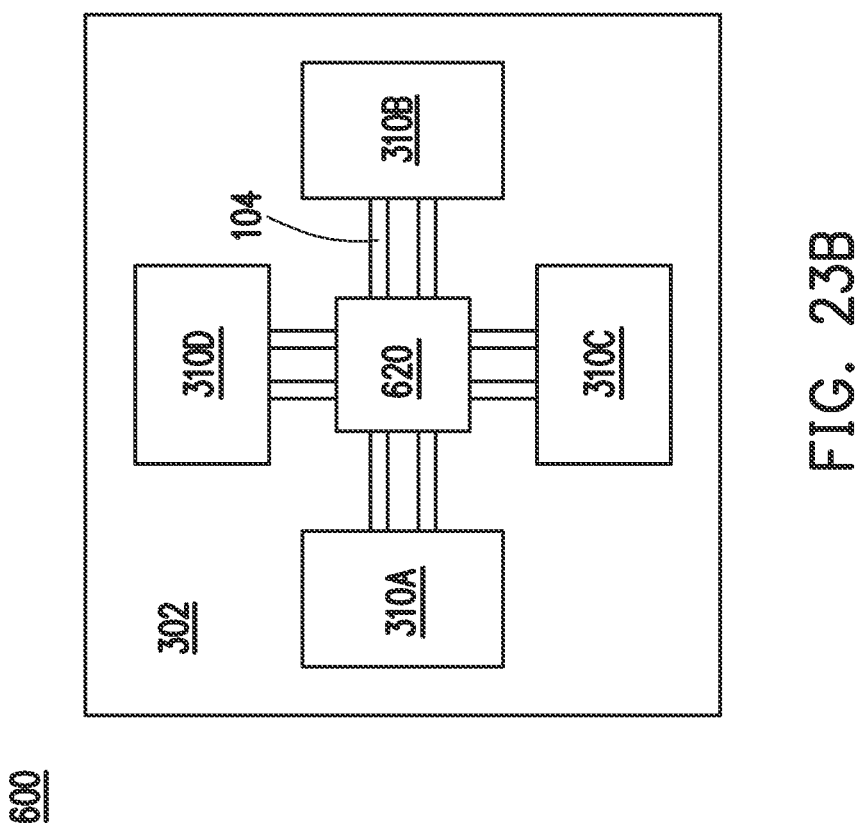

FIGS. 23A-B illustrates a cross-sectional view and a plan view of a computing system 600, in accordance with some embodiments. The computing system 600 includes an optical interposer 650 attached to an interconnect substrate 302, one or more semiconductor devices 310 connected to the optical interposer 650, and one or more optical switch devices 620 connected to the optical interposer 650. The optical interposer 650 may be similar to the optical interposer 450 described previously, except that the optical interposer 650 includes a photonic switch network 604 that is electrically connected to the optical switch device 620. The optical switch device 620 controls the transmission of optical signals within the optical interposer 650 using the photonic switch network 604, described in greater detail below.

The optical interposer 650 includes one or more waveguides 104 that allow for optical communication between two or more semiconductor devices 310 within the computing system 600. The semiconductor devices 310 may each be connected to photonic components that facilitate communication using optical signals within the waveguides 104. For example, FIG. 23A shows semiconductor device 310A connected to photonic components 120A/122A and semiconductor device 310B connected to photonic components 120B/122B. The waveguides 104 associated with each semiconductor device 310 may be coupled to the photonic switch network 604. FIG. 23B shows a single optical switch device 620 coupled to waveguides 104 associated with four semiconductor devices 310A-D, but other numbers of optical switch devices 620 or semiconductor devices 310 may be attached to the optical interposer 650 in any suitable arrangement or configuration. The photonic switch network 604 or waveguides 104 may also be arranged within the optical interposer 650 in any suitable arrangement or configuration. In some embodiments, the optical interposer 650 is formed in a similar manner as the optical interposer 450. In some embodiments, the optical interposer 650 may include an optical power source such as a laser diode or the like.

In some embodiments, the optical switch device 620 controls the transmission of optical signals within the optical interposer 650 using the photonic switch network 604. For example, the photonic switch network 604 may comprise waveguides and photonic components (e.g., optical modulators, etc.) that are coupled to the waveguides 104 and that may be controlled to control the optical signals within the waveguides 104. For example, the photonic switch network 604 may be controlled to copy, redirect, change, amplify, terminate, generate, or perform other functions on optical signals within the waveguides 104. In this manner, the optical switch device 620 can control the flow of data between semiconductor devices 310 or other components within the computing system 600. The optical switch device 620 may also detect and/or process optical signals within the waveguides 104, and may control the optical switching based on these optical signals. In some embodiments, the semiconductor devices 310 of a computing system 600 can be configured in a hierarchy structure in which the optical switch device 620 controls the data I/O of the computing system 600.

The optical interposer 650 described herein allows for high bandwidth and/or long distance communications between semiconductor devices 310 or other components using optical interconnects within a computing system 600, which can reduce the size, latency, or power consumption of a computing system 600. Additionally, the optical interposer 650 allows for electrical communications between semiconductor devices 310 or other components. A computing system 600 may include more or fewer components than shown in FIGS. 23A-B. In some embodiments, a computing system 600 includes an optional heat spreader that can facilitate heat dissipation. These and other configurations are considered within the scope of the present disclosure.

Figure 24:
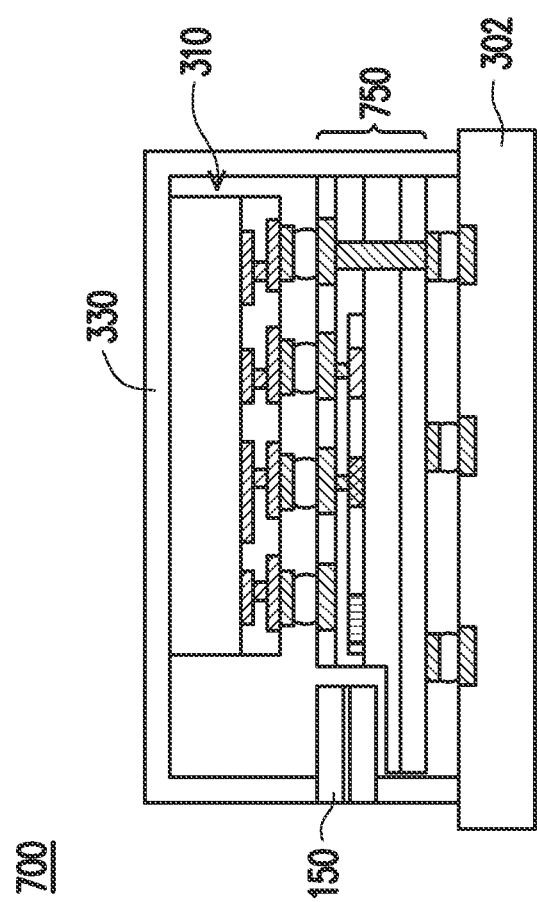
FIG. 24 shows a cross-sectional view of a computing unit, in accordance with some embodiments.

FIG. 24 illustrates a computing unit 700, in accordance with some embodiments. The computing unit 700 includes an optical interposer 750 connected to an interconnect substrate 302, and one or more semiconductor devices 310 connected to the optical interposer 750. The optical interposer 750 may be similar to the optical interposer 100 shown in FIG. 10 or 11. The optical interposer 750 is configured to facilitate optical communication from the optical fiber 150 to the semiconductor device 310 or from the semiconductor device 310 to the optical fiber 150. The optical interposer 750 may communicate with an optical network or external optically-connected components using one or more optical fibers 150. The optical interposer 750 allows for optical communications between a semiconductor device 310 of a computing unit 700 and external components. For example, two separate computing units 700 may use an optical fiber 150 to communicate using optical signals. A computing unit 700 may include more or fewer components than shown in FIG. 24.

Figure 25:
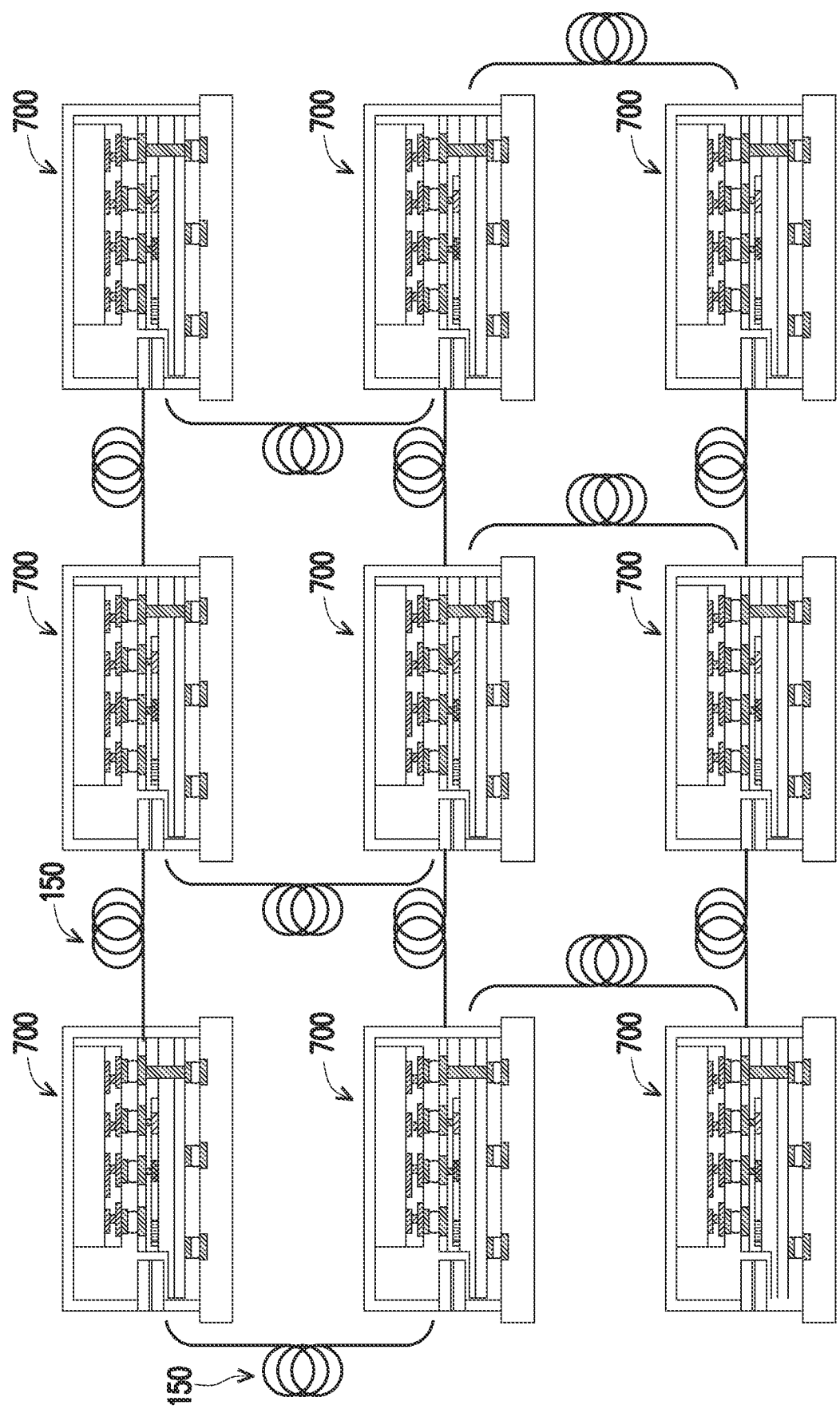
FIG. 25 shows a schematic illustration of a computing network having multiple computing units, in accordance with some embodiments.

FIG. 25 shows a schematic illustration of a computing network 800 comprising multiple computing units 700, in accordance with some embodiments. As shown in FIG. 25, each separate computing unit 700 may be optically connected to one or more other computing units 700 by optical fibers 150. The use of optical interposers 750 within the computing units 700 allows for high bandwidth optical communications between the computing units 700. Some or all of the computing units 700 may be similar, or some computing units 700 may be functionally or structurally different than other computing units 700. A computing network 800 may have a different number or a different configuration of computing units 700 than shown in FIG. 25. The use of multiple computing units 700 to form an optically-connected computing network 800 as described herein can allow for lower power consumption, lower latency, or higher-frequency operation of a computing network. The use of multiple separate computing units 700 can also allow for improved flexibility of the size or connectivity of a computing network.

The use of optical interposers as described herein may achieve advantages. The optical interposers facilitate high-speed optical communication between a computing system and external optically-connected components using optical fibers. The optical interposers also allow for high-speed optical communications between components within the same computing system. Use of optical interposers as described herein may reduce the size, power consumption, cost, or latency of a computing system while providing internal and/or external high-speed optical communication capability. Electrical interposers may be used in addition to optical interposers in order to provide electrical communication between components within a computing system. The use of optical interposers and electrical interposers allows for improved flexibility of design and reduced cost.

In accordance with an embodiment of the present disclosure, a package includes a first optical interposer attached to a package substrate, wherein the first optical interposer includes a first waveguide on a first substrate, and at least one photonic device on the first substrate, wherein the at least one photonic device is optically coupled to the first waveguide, a second optical interposer attached to the package substrate, wherein the second optical interposer includes a second waveguide on a second substrate, and at least one photonic device on the second substrate, wherein the at least one photonic device is optically coupled to the second waveguide, an electrical interposer attached to the package substrate, wherein the electrical interposer includes an interconnect structure on a third substrate, a first semiconductor device attached to the first optical interposer and to the electrical interposer, wherein the first semiconductor device is electrically connected to the at least one photonic device of the first optical interposer and to the interconnect structure of the electrical interposer, and a second semiconductor device attached to the second optical interposer and to the electrical interposer, wherein the second semiconductor device is electrically connected to the at least one photonic device of the second optical interposer and to the interconnect structure of the electrical interposer. In an embodiment, the package includes a first optical fiber attached to the first optical interposer, wherein the first optical fiber is optically coupled to the first waveguide. In an embodiment, the first optical interposer includes a grating coupler on the first substrate, wherein the first optical fiber is optically coupled to the first waveguide by the grating coupler. In an embodiment, the electrical interposer is disposed on the package substrate laterally between the first optical interposer and the second optical interposer. In an embodiment, the first semiconductor device includes a first semiconductor die bonded to a second semiconductor die. In an embodiment, the package includes a heat spreader covering the first semiconductor device and the second semiconductor device. In an embodiment, the at least one photonic device on the first substrate includes a photodetector or an optical modulator. In an embodiment, the first semiconductor device includes interface circuits associated with the at least one photonic device of the first optical interposer, and wherein the interface circuits are disposed directly over the at least one photonic device. In an embodiment, the first semiconductor device is connected to the first optical interposer by a first set of solder bumps and to the electrical interposer by a second set of solder bumps.

In accordance with an embodiment of the present disclosure, a structure includes an optical interposer attached to a package substrate, wherein the optical interposer includes a silicon waveguide, a first photonic component optically coupled to the silicon waveguide, a second photonic component optically coupled to the silicon waveguide, and an interconnect structure extending over the silicon waveguide, over the first photonic component, and over the second photonic component, wherein the interconnect structure is electrically connected to the first photonic component and to the second photonic component, a first semiconductor device attached to the interconnect structure, wherein the first semiconductor device is electrically connected to the first photonic component through the interconnect structure, and a second semiconductor device attached to the interconnect structure, wherein the second semiconductor device is electrically connected to the second photonic component through the interconnect structure. In an embodiment, the interconnect structure includes at least one conductive line that is electrically connected to the first semiconductor device and to the second semiconductor device. In an embodiment, the optical interposer includes a through via that is electrically connected to the interconnect structure and to the package substrate. In an embodiment, the package substrate includes a recess, and wherein the optical interposer is disposed within the recess. In an embodiment, the structure includes an optical modulator disposed within the silicon waveguide between the first photonic component and the second photonic component, and the structure includes a third semiconductor device attached to the interconnect structure, wherein the third semiconductor device is electrically connected to the optical modulator. In an embodiment, the first semiconductor device includes a Machine Learning (ML) accelerator die. In an embodiment, the first photonic component includes a photodetector or an optical modulator.

In accordance with an embodiment of the present disclosure, a method forming a first optical interposer includes patterning a silicon layer disposed on a first substrate to form a waveguide, forming a photodetector and an optical modulator adjacent the waveguide, forming a dielectric layer over the waveguide, the photodetector, and the optical modulator, and forming conductive contacts extending through the dielectric layer to contact the photodetector and the optical modulator, forming an electrical interposer, including forming through vias extending through a second substrate, forming a redistribution structure on the through vias and on the second substrate, attaching the first optical interposer and the electrical interposer to an interconnect substrate, and attaching a first semiconductor device to the first optical interposer and to the electrical interposer, wherein the first semiconductor device is electrically connected to the first optical interposer and to the electrical interposer. In an embodiment, the method includes attaching an optical fiber to the first optical interposer, wherein the optical fiber is optically coupled to the waveguide. In an embodiment, the method includes attaching a second optical interposer to the interconnect substrate, and also includes attaching a second semiconductor device to the second optical interposer and to the electrical interposer, wherein the second semiconductor device is electrically connected to the second optical interposer and to the electrical interposer. In an embodiment, the method includes attaching a heat spreader to the interconnect substrate, the heat spreader extending over the first semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a first optical interposer attached to a package substrate, wherein the first optical interposer comprises a first waveguide optically coupled to a first photonic device;
   a second optical interposer attached to the package substrate, wherein the second optical interposer comprises a second waveguide optically coupled to a second photonic device;
   an electrical interposer attached to the package substrate, wherein the electrical interposer is separated from the first optical interposer and the second optical interposer; and
   a first semiconductor device attached to the first optical interposer and to the electrical interposer, wherein the first semiconductor device is electrically connected to the first optical interposer and to the electrical interposer.

2. The package of claim 1 further comprising a second semiconductor device attached to the second optical interposer and to the electrical interposer, wherein the second semiconductor device is electrically connected to the second optical interposer and to the electrical interposer.

3. The package of claim 1, wherein the first photonic device is a photodetector or an optical modulator.

4. The package of claim 1, wherein the first optical interposer further comprises a grating coupler optically coupled to the first waveguide.

5. The package of claim 4 further comprising a reflector over the grating coupler.

6. The package of claim 1, wherein the second optical interposer further comprises an edge coupler optically coupled to the second waveguide.

7. The package of claim 1, wherein the first optical interposer, the second optical interposer, and the electrical interposer are electrically connected to the package substrate.

8. The package of claim 1, wherein the first waveguide is a silicon waveguide.

9. A device comprising:
   an interposer comprising a waveguide, a first photonic component optically coupled to the waveguide, a second photonic component optically coupled to the waveguide, and a plurality of conductive lines over the waveguide;
   a first semiconductor die on the interposer, wherein the first semiconductor die is electrically coupled to the first photonic component; and
   a second semiconductor die on the interposer, wherein the second semiconductor die is electrically coupled to the second photonic component.

10. The device of claim 9, wherein at least one conductive line of the plurality of conductive lies electrically couples the first semiconductor die to the second semiconductor die.

11. The device of claim 9, wherein the waveguide extends underneath the first semiconductor die and the second semiconductor die.

12. The device of claim 9, wherein the interposer is attached to a package substrate.

13. The device of claim 12, wherein a top surface of the interposer and a top surface of the package substrate are level.

14. The device of claim 9, wherein the interposer further comprises a photonic switch network coupled to the waveguide.

15. The device of claim 14 further comprising an optical switch device on the interposer, wherein the optical switch device is electrically coupled to the photonic switch network.

16. A method comprising:
- bonding a first optical interposer to a package substrate, wherein the first optical interposer comprises a first waveguide and a first photonic component;
- bonding a second optical interposer to the package substrate, wherein the second optical interposer comprises a second waveguide and a second photonic component;
- bonding a first electrical interposer to the package substrate, wherein the first electrical interposer comprises an interconnect structure;
- connecting a first semiconductor die to the first optical interposer and to the electrical interposer; and
- connecting a second semiconductor die to the second optical interposer and to the electrical interposer.

17. The method of claim 16 further comprising attaching an optical fiber to a top side of the first optical interposer, wherein the optical fiber is optically coupled to the first waveguide.

18. The method of claim 16 further comprising attaching an optical fiber to a sidewall of the first optical interposer, wherein the optical fiber is optically coupled to the first waveguide.

19. The method of claim 16, wherein the first optical interposer is laterally separated from the second optical interposer.

20. The method of claim 16, wherein the first semiconductor die is electrically connected to the first photonic component.

* * * * *